(12) United States Patent　　(10) Patent No.: US 11,754,598 B2
Hatani et al.　　(45) Date of Patent: Sep. 12, 2023

(54) VOLTAGE MEASUREMENT DEVICE, VOLTAGE DETECTION CIRCUIT, AND DEVICE ADDRESS GENERATION METHOD

(71) Applicant: PANASONIC SEMICONDUCTOR SOLUTIONS CO., LTD., Kyoto (JP)

(72) Inventors: Naohisa Hatani, Kyoto (JP); Jiro Miyake, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 392 days.

(21) Appl. No.: 16/997,476

(22) Filed: Aug. 19, 2020

(65) Prior Publication Data

US 2020/0379019 A1　　Dec. 3, 2020

Related U.S. Application Data

(63) Continuation of application No. PCT/JP2019/006587, filed on Feb. 21, 2019.

(30) Foreign Application Priority Data

Feb. 23, 2018　(JP) ................ 2018-031122

(51) Int. Cl.
　　*G01R 19/00*　　(2006.01)
　　*G01R 31/396*　　(2019.01)
　　*H01M 10/48*　　(2006.01)

(52) U.S. Cl.
　　CPC ....... *G01R 19/0084* (2013.01); *G01R 31/396* (2019.01); *H01M 10/48* (2013.01); *H01M 10/482* (2013.01)

(58) Field of Classification Search
　　CPC .............. G01R 19/0084; G01R 31/396; G01R 19/16542; H01M 10/48; H01M 10/482;
　　(Continued)

(56) References Cited

U.S. PATENT DOCUMENTS 7,511,457 B2 *　3/2009　Emori ............... B60L 58/15
　　　　　　　　　　　　　　　　　320/118
2007/0189313 A1 *　8/2007　Bartley ............. G06F 11/201
　　　　　　　　　　　　　　　　　370/406
(Continued)

FOREIGN PATENT DOCUMENTS

JP　　2000-010902 A　　1/2000
JP　　2010-228523 A　　10/2010
(Continued)

OTHER PUBLICATIONS

Extended European Search Report dated Dec. 23, 2020 issued in corresponding European Patent Application No. 19756835.5.
(Continued)

*Primary Examiner* — Daniel R Miller
(74) *Attorney, Agent, or Firm* — McDermott Will & Emery LLP

(57) ABSTRACT

A voltage measurement device includes: a plurality of voltage detection circuits which measure cell voltages of a plurality of cells connected in series. Each of the plurality of voltage detection circuits includes: a device address generating circuit which generates a device address according to a first address assignment command received from a preceding voltage detection circuit located at a preceding stage; and an address assignment command generating circuit which generates a second address assignment command according to the first address assignment command, and sends the second address assignment command to a next voltage detection circuit located at a next stage.

15 Claims, 17 Drawing Sheets

(58) Field of Classification Search
CPC . H01M 2010/4271; G05B 2219/15072; G05B 2219/21039; H04L 12/437; H02J 7/0014; Y02E 60/10
See application file for complete search history.

(56) References Cited

U.S. PATENT DOCUMENTS

| | | |
|---|---|---|
| 2011/0050236 A1 | 3/2011 | Sekizaki et al. |
| 2012/0025769 A1 | 2/2012 | Kikuchi et al. |
| 2013/0187610 A1* | 7/2013 | Hayashi ............ H02J 7/00 320/118 |
| 2015/0102943 A1 | 4/2015 | de Greef et al. |
| 2016/0055890 A1* | 2/2016 | Matsuo ............ G01R 31/382 365/230.01 |

FOREIGN PATENT DOCUMENTS

| | | |
|---|---|---|
| JP | 2011-050176 A | 3/2011 |
| JP | 2015-149834 A | 8/2015 |

OTHER PUBLICATIONS

International Search Report and Written Opinion dated May 7, 2019 in International Patent Application No. PCT/JP2019/006587; with partial English translation.

* cited by examiner

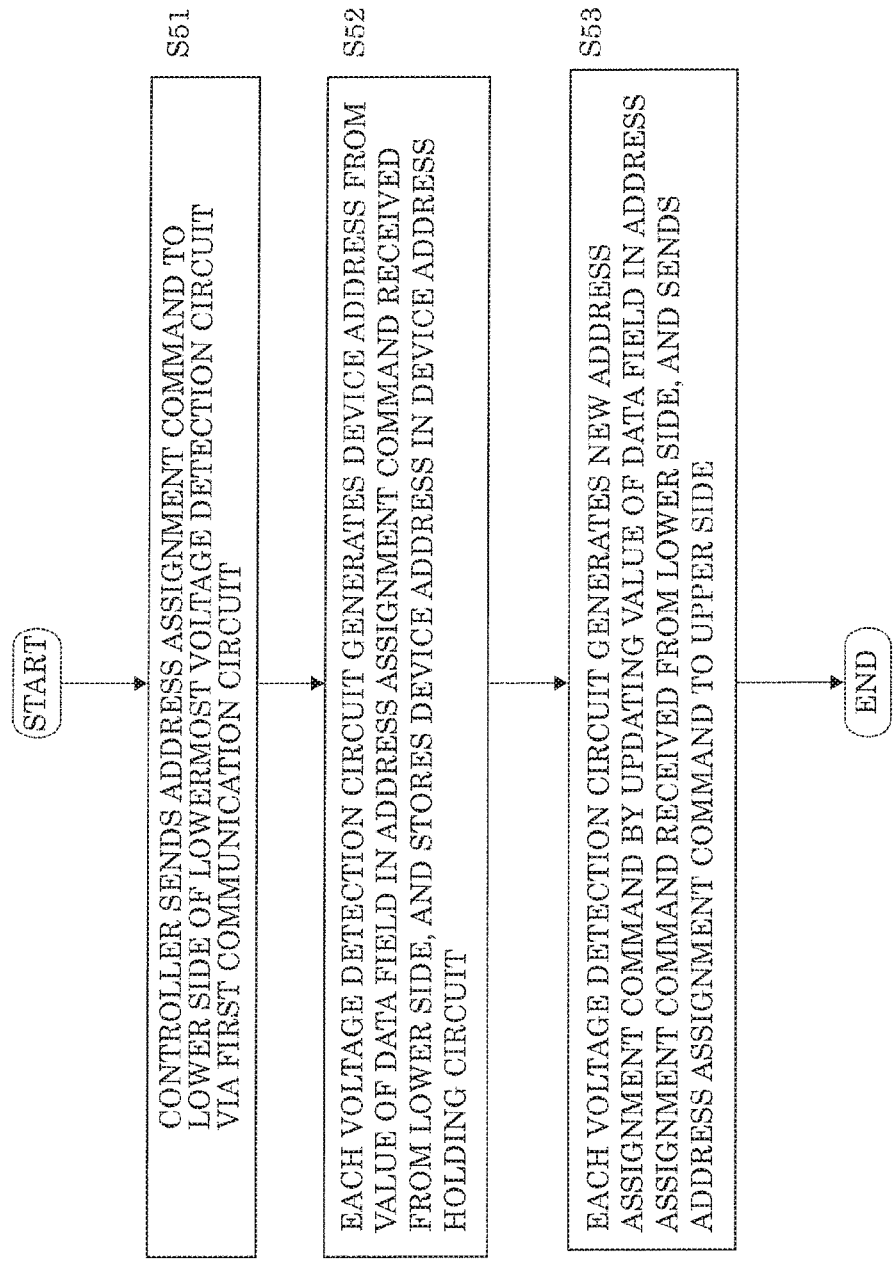

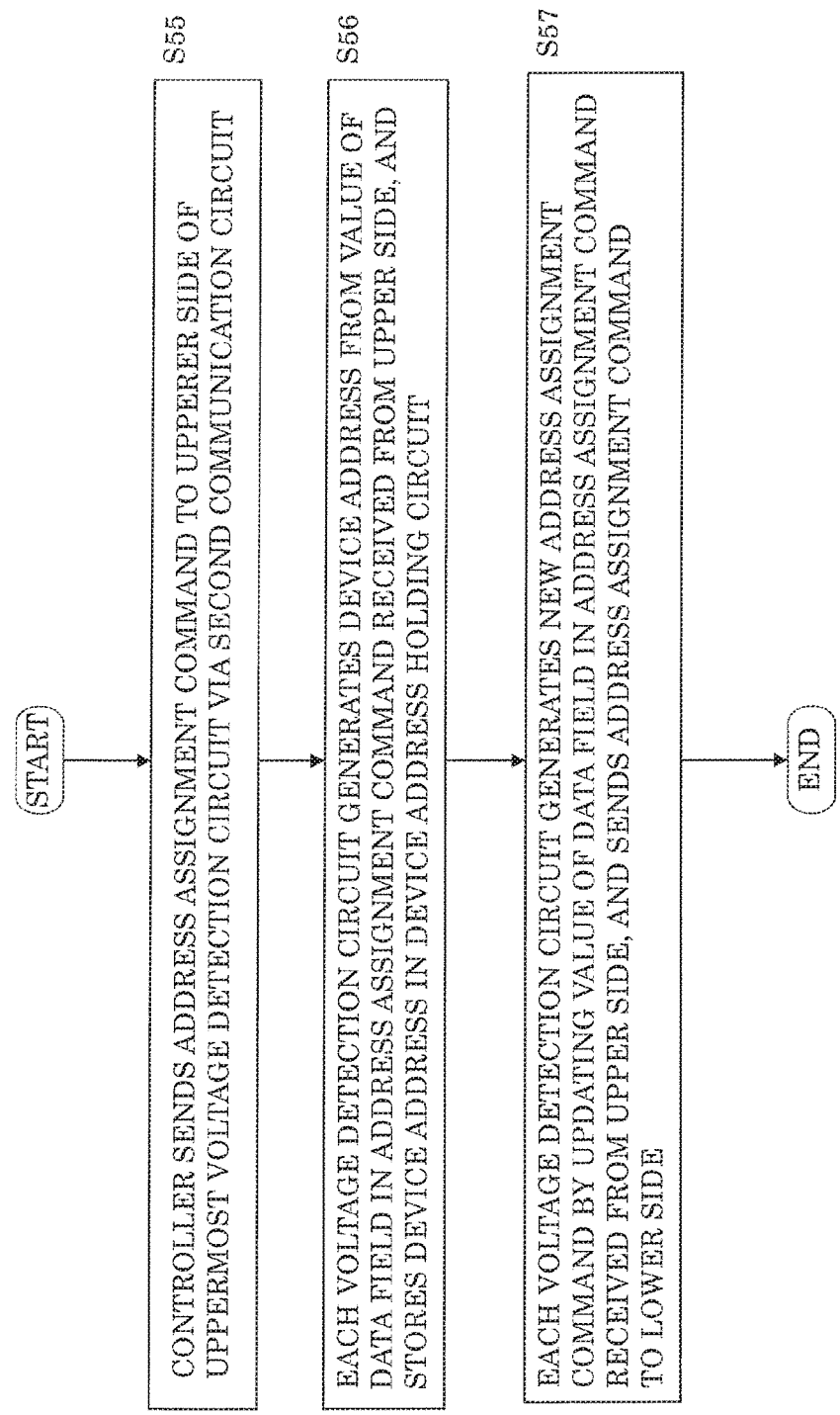

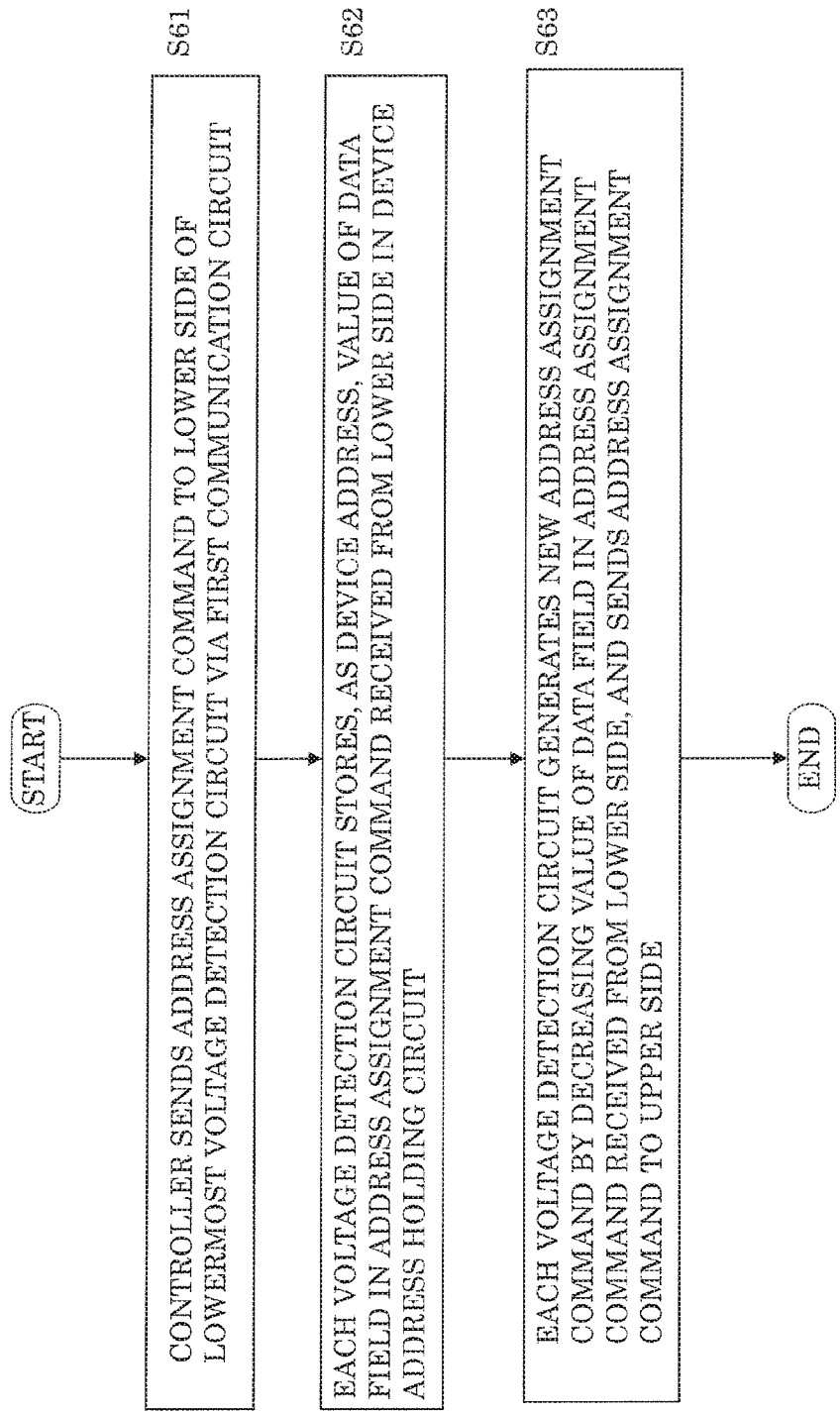

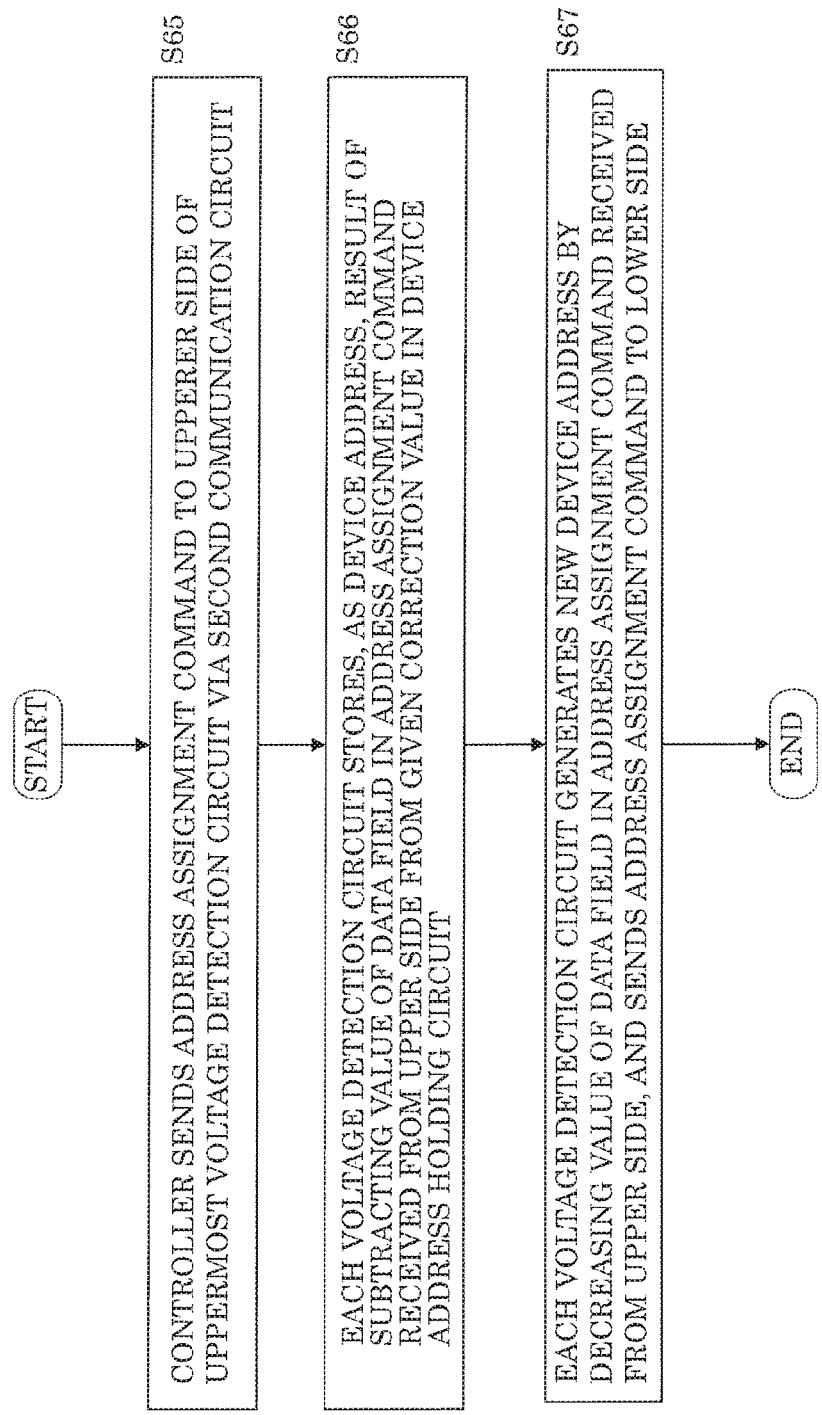

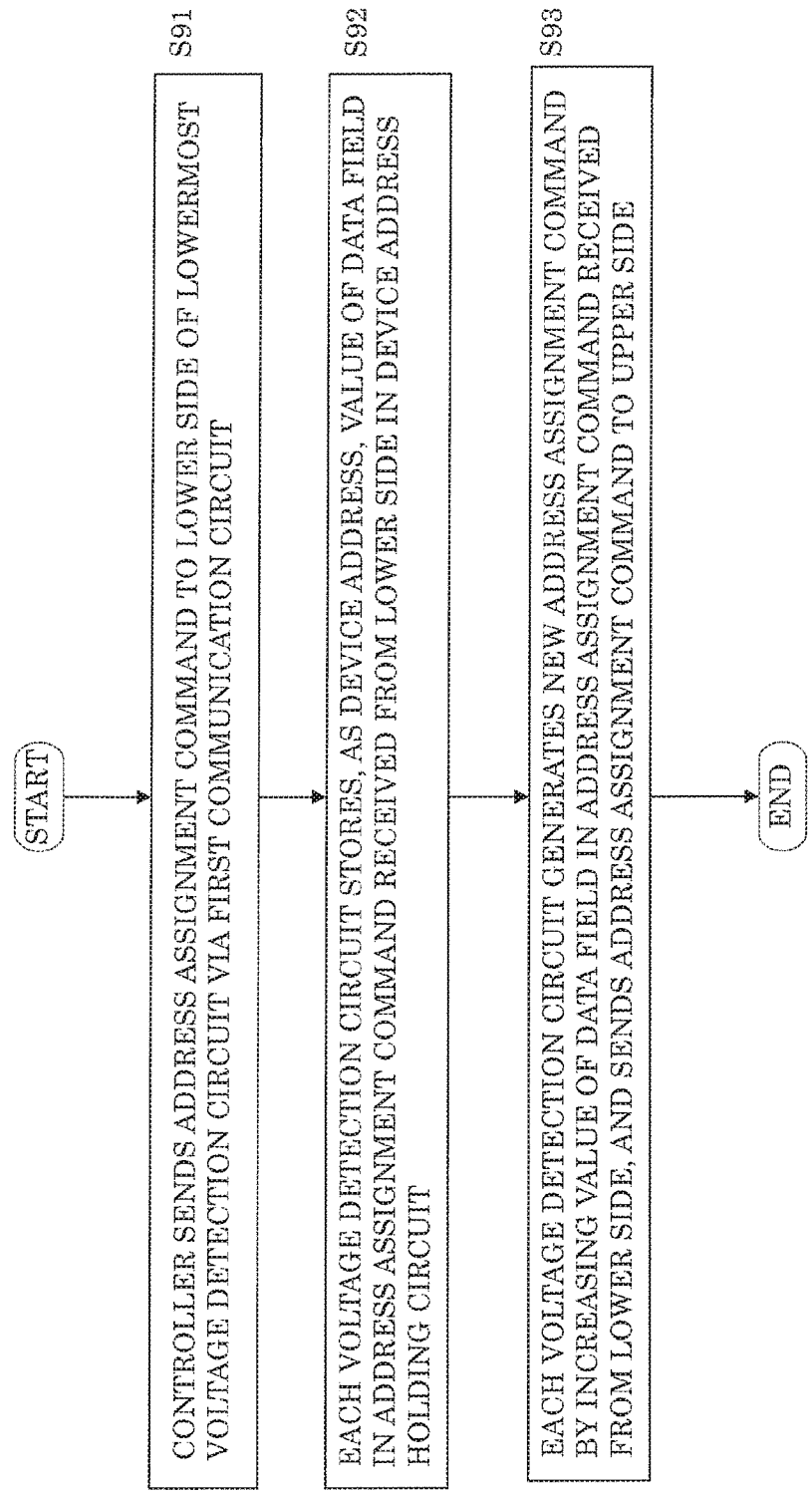

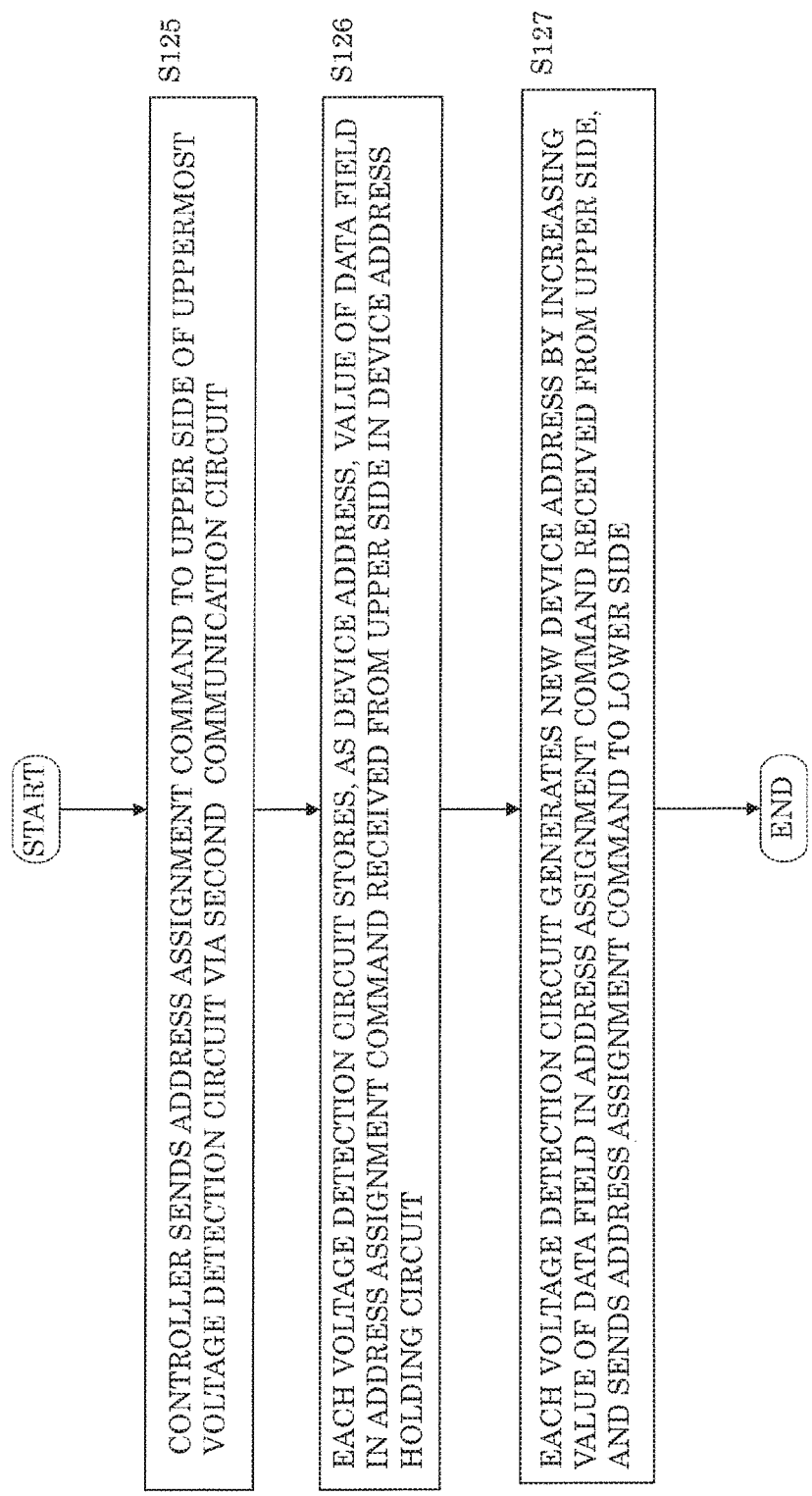

VOLTAGE MEASUREMENT DEVICE, VOLTAGE DETECTION CIRCUIT, AND DEVICE ADDRESS GENERATION METHOD

CROSS REFERENCE TO RELATED APPLICATIONS

This application is a U.S. continuation application of PCT International Patent Application Number PCT/JP2019/006587 filed on Feb. 21, 2019, claiming the benefit of priority of Japanese Patent Application Number 2018-031122 filed on Feb. 23, 2018, the entire contents of which are hereby incorporated by reference.

BACKGROUND

1. Technical Field

The present disclosure relates to a voltage measurement device, a voltage detection circuit, and a device address generation method.

2. Description of the Related Art

Japanese Unexamined Patent Application Publication No. 2011-50176 discloses a voltage measurement device including a plurality of voltage detection circuits which are connected in a daisy chain according to a conventional technique.

When a failure is present in a communication path between any one of a plurality of voltage detection circuits, the prior art has a problem that it is impossible to set a device address to a voltage detection circuit located at an upper side above a failure part.

SUMMARY

The present disclosure has an object to provide a voltage measurement device, a voltage detection circuit, and a device address generation method which make it possible to set a device address to a voltage detection circuit located over a failure part.

A voltage measurement device according to an aspect of the present disclosure includes: a plurality of voltage detection circuits which measure cell voltages of a plurality of cells connected in series. Each of the plurality of voltage detection circuits includes: a device address generating circuit which generates a device address according to a first address assignment command received from a preceding voltage detection circuit located at a preceding stage; and an address assignment command generating circuit which generates a second address assignment command according to the first address assignment command, and sends the second address assignment command to a next voltage detection circuit located at a next stage.

A voltage detection device according to an aspect of the present disclosure is a voltage detection circuit which measures cell voltages of a plurality of cells connected in series. The voltage detection circuit is one of a plurality of voltage detection circuits included in a voltage measurement device. The voltage detection circuit includes: a device address generating circuit which generates a device address according to a first address assignment command received from a preceding voltage detection circuit located at a preceding stage; and an address assignment command generating circuit which generates a second address assignment command according to the first address assignment command, and sends the second address assignment command to a next voltage detection circuit located at a next stage.

A device address generating method according to an aspect of the present disclosure is a device address generating method which is performed by a voltage measurement device which measures cell voltages of a plurality of cells connected in series and includes a plurality of voltage detection circuits. The device address generating method includes: generating a device address according to a first address assignment command received from a preceding voltage detection circuit located at a preceding stage; and generating a second address assignment command according to the first address assignment command, and sending the second address assignment command to a next voltage detection circuit located at a next stage.

An aspect of the present disclosure is a voltage measurement device including: a plurality of voltage detection circuits which measure cell voltages of a battery pack configured to include a plurality of cells connected in series; a controller; a first communication circuit; and a second communication circuit. The plurality of voltage detection circuits are connected in a daisy chain. The voltage detection circuit includes: a lower communication circuit which receives communications from a lower side and sends communications to a lower side; a lower device address generating circuit which generates a device address from an address assignment command received by the lower communication circuit; a lower next-device address generating circuit which generates a device address for a next voltage detection circuit from the address assignment command; a lower address assignment command generating circuit which generates an address assignment command for a next stage using, as a value of a data field, the device address generated by the lower next-device address generating circuit; an upper communication circuit which receives communications from an upper side and sends communications to an upper side; an upper device address generating circuit which generates a device address from an address assignment command received by the upper communication circuit; an upper next-device address generating circuit which generates a device address for a next voltage detection circuit from the address assignment command; an upper address assignment command generating circuit which generates an address assignment command for a next stage using, as a value of a data field, the device address generated by the upper next-device address generating circuit; and a device address holding circuit which stores the device address generated by the lower device address generating circuit and the device address generated by the upper device address generating circuit. The lower communication circuit sends the address assignment command which is generated by the upper address assignment command generating circuit, and the upper communication circuit sends the address assignment command which is generated by the lower address assignment command generating circuit. The controller is connected to a voltage detection circuit located at a lowermost stage via the first communication circuit and a voltage detection circuit located at an uppermost stage via the second communication circuit, and sends the address assignment commands.

An aspect of the present disclosure is a voltage detection circuit for use in the voltage measurement device.

An aspect of the present disclosure is a battery pack system including a battery pack configured to include the voltage measurement device and a plurality of cells connected in series.

An aspect of the present disclosure is a voltage measurement method in a voltage measurement system including: a plurality of voltage detection circuits which measure cell voltages of a battery pack configured to include a plurality of cells connected in series; a controller; a first communication circuit; and a second communication circuit. The plurality of voltage detection circuits are connected in a daisy chain. The controller is connected to a lowermost voltage detection circuit via the first communication circuit, is connected to an uppermost voltage detection circuit via the second communication circuit, sends the communication commands, and receives the replies. Each of the voltage detection circuits includes a device address holding circuit. The voltage measurement method includes: a step in which the controller sends an address assignment command to the lower side of the lowermost voltage detection circuit via the first communication path; a step in which the voltage detection circuit generates a device address from a value of a data field in the address assignment command received from a lower side, and stores the device address in the device address holding circuit; a step in which the voltage detection circuit generates a new address assignment command by updating the value of the data field in the address assignment command received from the lower side, and sends the new address assignment command to an upper side; a step in which the controller sends the address assignment command to the upper side of the uppermost voltage detection circuit via the second communication path; a step in which the voltage detection circuit generates a device address from a value of a data field in the address assignment command received from an upper side, and stores the device address in the device address holding circuit; and a step in which the voltage detection circuit generates the new address assignment command by updating the value of the data field in the address assignment command received from the upper side, and sends the new address assignment command to a lower side.

According to the present disclosure, it is possible to set a device address to a voltage detection circuit located over a failure part.

For example, according to the present disclosure, even when there is a failure in a communication path between voltage detection circuits, it is possible to set a device address for a voltage detection circuit located at a lower side below a failure part according to an address assignment command from the lower side and set a device address for a voltage detection circuit located at an upper side above a failure part according to an address assignment command from the upper side.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 5A is a diagram explaining a voltage measurement method according to Embodiment 1.

FIG. 5B is a diagram explaining a voltage measurement method according to Embodiment 1.

FIG. 6A is a diagram explaining a voltage measurement method according to Embodiment 1.

FIG. 6B is a diagram explaining a voltage measurement method according to Embodiment 1.

FIG. 9A is a diagram explaining a voltage measurement method according to Embodiment 1.

FIG. 12B is a diagram explaining a voltage measurement method according to Embodiment 1.

DETAILED DESCRIPTION OF THE EMBODIMENTS

Embodiment 1

Figure 1A:
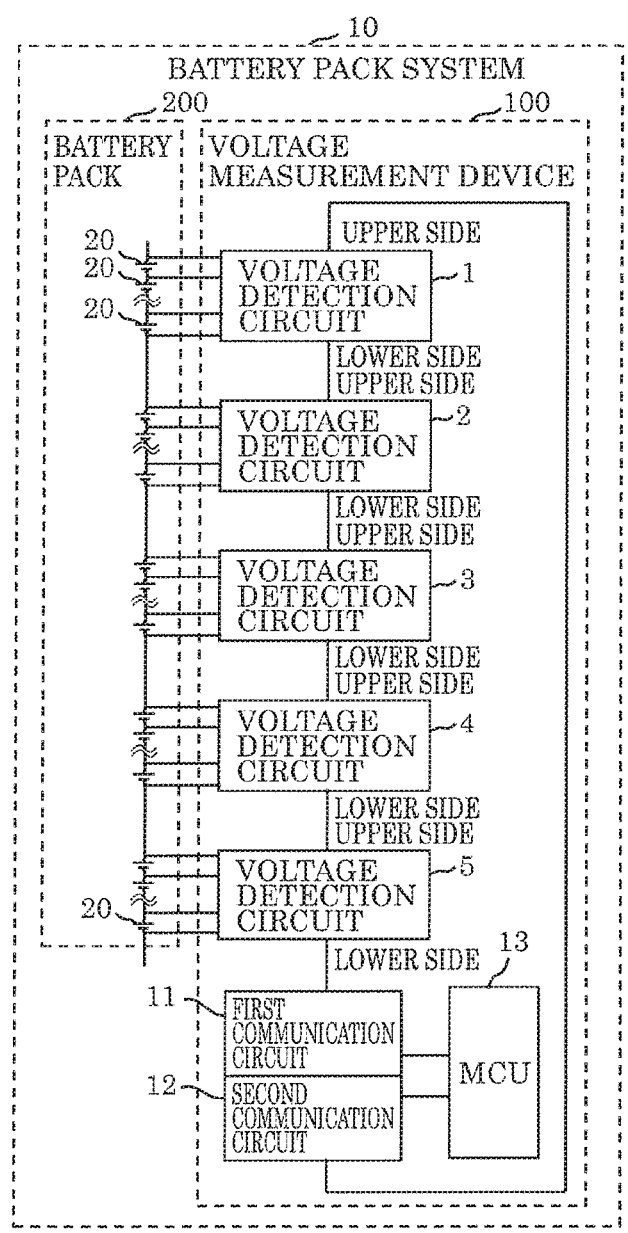
FIG. 1A is a configuration diagram of a battery pack system which includes a voltage measurement device including voltage detection circuits, according to Embodiment 1.

FIG. 1A is a configuration diagram of a battery pack system which includes a voltage measurement device including voltage detection circuits, according to Embodiment 1.

Figure 1B:
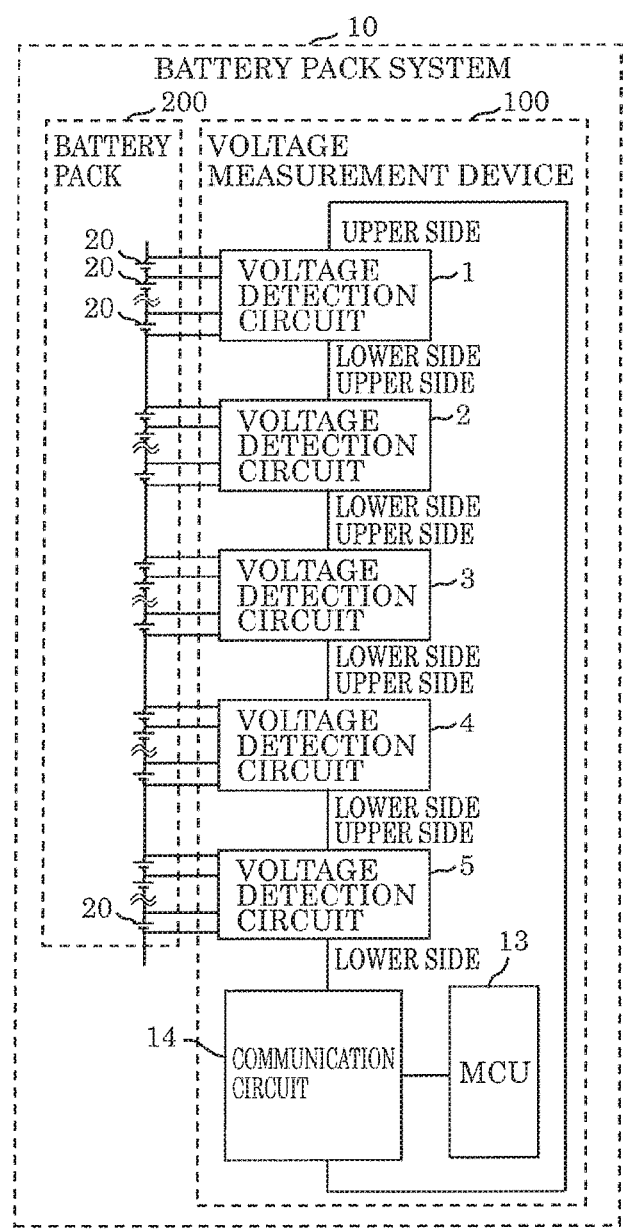
FIG. 1B is a configuration diagram of a battery pack system which includes a voltage measurement device including voltage detection circuits, according to Embodiment 1.

Battery pack system 10 includes voltage measurement device 100 and battery pack 200. Voltage measurement device 100 includes a plurality of voltage detection circuits 1 to 5, first communication circuit 11, second communication circuit 12, and controller 13. Controller 13 is illustrated as an MCU (Micro Computer Unit) in FIG. 1A. In addition, battery pack 200 is configured with a plurality of cells 200 connected in series. It is to be noted that, as illustrated in FIG. 1B, battery pack system 10 may be configured to include communication circuit 14 instead of first communication circuit 11 and second communication circuit 12 in FIG. 1A.

As illustrated in FIG. 1A to FIG. 6B, voltage measurement device 100 according to Embodiment 1 is voltage measurement device 100 including: a plurality of voltage detection circuits which measure cell voltages of battery pack 200 configured to include a plurality of cells 20 connected in series; controller 13; first communication circuit 11; and second communication circuit 12. The plurality of voltage detection circuits are connected in a daisy chain. The voltage detection circuit includes: lower communication circuit 26 which receives communications from a lower side and sends communications to a lower side; lower device address generating circuit 281 which generates a device address from an address assignment command received by lower communication circuit 26; lower next-device address generating circuit 282 which generates a device address for a next voltage detection circuit from the address assignment command; lower address assignment command generating circuit 283 which generates an address assignment command for a next stage using, as a value of a data field, the device address generated by lower next-device address generating circuit 282; upper communication circuit 25 which receives communications from an upper side and sends communications to an upper side; upper device address generating circuit 271 which generates a device address from an address assignment command received by upper communication circuit 25; upper next-device address generating circuit 272 which generates a device address for a next voltage detection circuit from the address assignment command; upper address assignment command generating circuit 273 which generates an address assignment command for a next stage using, as a value of a data field, the device address generated by upper next-device address generating circuit 272; and device address holding circuit 21 which stores the device address generated by lower device address generating circuit 281 and the device address generated by upper device address generating circuit 271. Lower communication circuit 26 sends the address assignment command which is generated by upper address assignment command generating circuit 273, and upper communication circuit 25 sends the address assignment command which is generated by lower address assignment command generating circuit 283. Controller 13 is connected to the lowermost voltage detection circuit via first communication circuit 11 and to the uppermost voltage detection circuit via second communication circuit 12, and sends the address assignment commands.

In addition, lower device address generating circuit 281 extracts a value of a data field in the address assignment command, and outputs the value as a device address. Lower next-device address generating circuit 282 generates a device address for a next voltage detection circuit by decreasing the value of the data field in the address assignment command. Upper device address generating circuit 271 subtracts the value of the data field in the address assignment command from a given correction value, and outputs the result as a device address. Upper next-device address generating circuit 272 generates a device address for a next voltage detection circuit by decreasing the value of the data field in the address assignment command.

In addition, the correction value is included in the address assignment command, and is extracted by the upper device address generating circuit 271.

Details are further described with reference to the drawings.

As illustrated in FIG. 1A, voltage measurement device 100 according to Embodiment 1 includes: a plurality of voltage detection circuits which measure cell voltages of battery pack 200 configured to connect a plurality of cells 20 in series; controller 13 (MCU); first communication circuits 11 and second communication circuits 12. The plurality of voltage detection circuits are connected in a daisy chain.

Here, voltage measurement 100 is described to facilitate understanding of the present disclosure.

Figure 2:
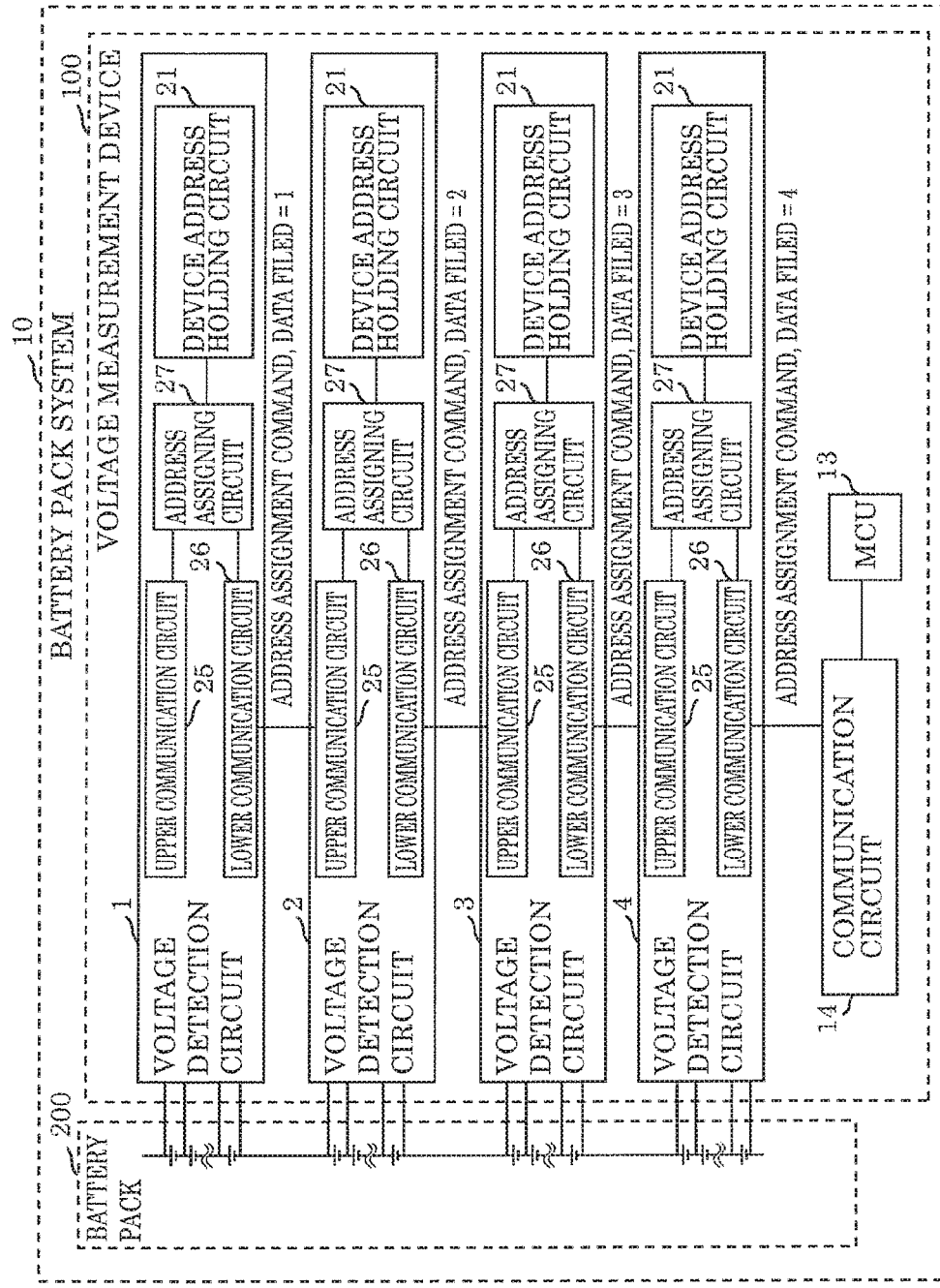
FIG. 2 is a configuration diagram of a battery pack system according to Embodiment 1.

FIG. 2 is a configuration diagram of a battery pack system. Battery pack system 10 in the diagram includes voltage measurement device 100 and battery pack 200. Voltage measurement device 100 includes a plurality of voltage detection circuits 1 to 4, controller 13 and communication circuit 14. Each of voltage detection circuits 1 to 4 in FIG. 2 includes device address holding circuit 21, upper communication circuit 25, lower communication circuit 26, and address assigning circuit 27.

As illustrated in FIG. 2, voltage measurement device 100 includes: a plurality of voltage detection circuits which measure cell voltages of battery pack 200 configured to include a plurality of cells 20 connected in series; controller 13 (MCU); and a communication circuit. The plurality of voltage detection circuits are connected in a daisy chain.

In addition, the address assignment command is a command for setting, for each of voltage detection circuits, a device address for identifying the voltage detection circuit. The command has a data field, and a value of the data field is set as the device address.

In addition, the voltage detection circuit includes upper communication circuit 25, lower communication circuit 26, address assigning circuit 27, and device address holding circuit 21.

In addition, address assigning circuit 27 reads the communication command received from lower communication circuit 26. When the communication command is an address assignment command, address assigning circuit 27 sets the value of the data field to device address holding circuit 21, generates a new address assignment command by subtracting 1 from the value of the data field, and assigns upper communication circuit 25 with the new address assignment command. Upper communication circuit 25 sends the new address assignment command to the upper voltage detection circuit.

With this configuration, for example, when the MCU assigns the lowermost voltage detection circuit with an address assignment command including a data field in which a value which has been set is 4 via the communication path, values of 4, 3, 2, and 1 are set in device address holding circuit 21 sequentially from the lowermost stage.

When a failure is present in a communication path between any one of a plurality of voltage detection circuits, this configuration has a problem that it is impossible to set a device address to a voltage detection circuit located at an upper side above a failure part. For example, when a communication path between voltage detection circuits 2 and 3 are disconnected, there occurs a problem that it is impossible to set a device address to each of voltage detection circuits 1 and 2.

In contrast, the voltage detection circuit, voltage measurement device 100, battery pack system 10, and the voltage measurement method according to Embodiment 1 make it possible to solve the above-described problem. Details are described with reference to the drawings.

Figure 3:
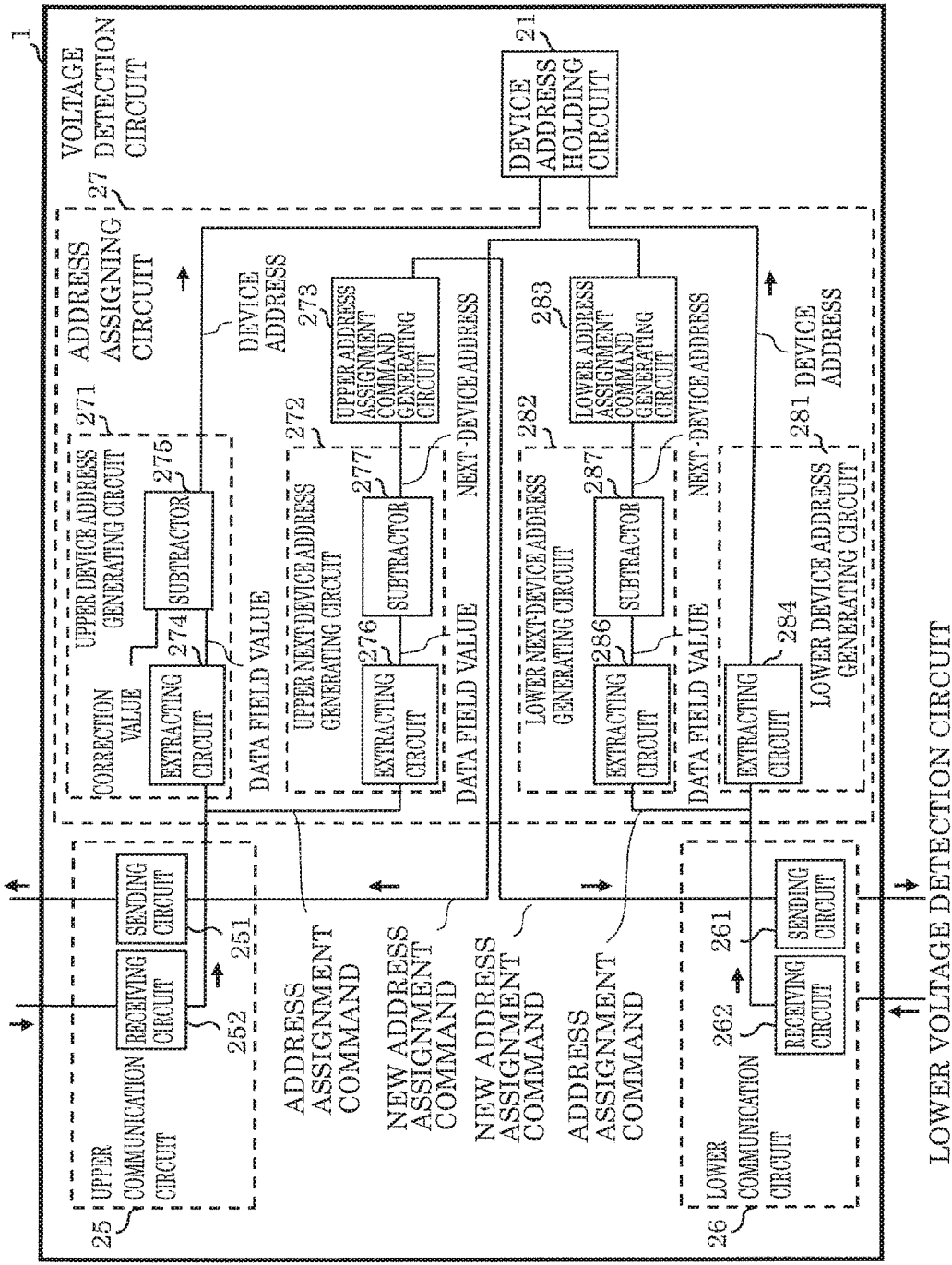
FIG. 3 is a diagram illustrating one of the voltage detection circuits according to Embodiment 1.

FIG. 3 is a diagram illustrating one of the voltage detection circuits according to Embodiment 1.

In addition, voltage detection circuit 1 includes device address holding circuit 21, upper communication circuit 25, lower communication circuit 26, and address assigning circuit 27. Upper communication circuit 25 includes sending circuit 251 and receiving circuit 252. Lower communication circuit 26 includes sending circuit 261 and receiving circuit 262. Address assigning circuit 27 includes: upper device address generating circuit 271; upper next-device address generating circuit 272; upper address assignment command generating circuit 273; lower device address generating circuit 281; lower next-device address generating circuit 282; and lower address assignment command generating circuit 283. Upper device address generating circuit 271 includes extracting circuit 274 and subtractor 275. Upper next-device address generating circuit 272 includes extracting circuit 276 and subtractor 277. Lower next-device address generating circuit 282 includes extracting circuit 286 and subtractor 287. It is to be noted that voltage detection circuits 2 to 4 illustrated in FIGS. 1A and 1B are configured to have a similar configuration.

As illustrated in FIG. 3, voltage detection circuit 1 includes the circuits below. The circuits are: lower communication circuit 26 which receives communications from a lower side and sends communications to a lower side; lower device address generating circuit 281 which generates a device address from an address assignment command received by lower communication circuit 26; lower next-device address generating circuit 282 which generates a device address for a next voltage detection circuit from the address assignment command; lower address assignment command generating circuit 283 which generates an address assignment command for a next stage using, as a value of a data field, the device address generated by lower next-device address generating circuit 282; upper communication circuit 25 which receives communications from an upper side and sends communications to an upper side; upper device address generating circuit 271 which generates a device address from an address assignment command received by upper communication circuit 25; upper next-device address generating circuit 272 which generates a device address for a next voltage detection circuit from the address assignment command; upper address assignment command generating circuit 273 which generates an address assignment command for a next stage using, as a value of a data field, the device address generated by upper next-device address generating circuit 272; and device address holding circuit 21 which stores the device address generated by lower device address generating circuit 281 and the device address generated by upper device address generating circuit 271.

In addition, as illustrated in FIG. 3, lower communication circuit 26 sends an address assignment command which is generated by upper address assignment command generating circuit 273. Upper communication circuit 25 sends an address assignment command which is generated by lower address assignment command generating circuit 283. Controller 13 is connected to a lowermost voltage detection circuit via first communication circuit 11 and to an uppermost voltage detection circuit via second communication circuit 12, and sends the address assignment commands.

In addition, as illustrated in FIG. 3, when lower communication circuit 26 receives an address assignment command from a lower side as an address assignment command from the lower side, lower device address generating circuit 281 extracts a value of a data field in the address assignment command received, and stores the value as a device address in device address holding circuit 21.

At the same time, lower next-device address generating circuit 282 causes a subtractor to subtract 1 from the value of the data field extracted and output the result as a next-device address. Lower address assignment command generating circuit 283 generates a new address assignment command in which the next-device address is the value of the data field. Upper communication circuit 25 sends the new address assignment command to an upper side.

In addition, as illustrated in FIG. 3, when upper communication circuit 25 receives an address assignment command from the upper side as an address assignment command from the upper side, upper device address generating circuit 271 extracts a value of a data field in the address assignment command, subtracts the value of the data field from a given correction value, and stores the result as a device address in device address holding circuit 21.

At the same time, upper next-device address generating circuit 272 causes a subtractor to subtract 1 from the value of the data field extracted and output the result as a next-device address. Upper address assignment command generating circuit 273 generates a new address assignment command in which the next-device address is the value of the data field. Lower communication circuit 26 sends the new address assignment command to a lower side.

It is to be noted that the correction value may be included in an address assignment command and be provided to upper next-device address generating circuit 272, or may be set in each of voltage detection circuits in advance in a different communication command.

Next, an address assignment command is described.

Figure 4:
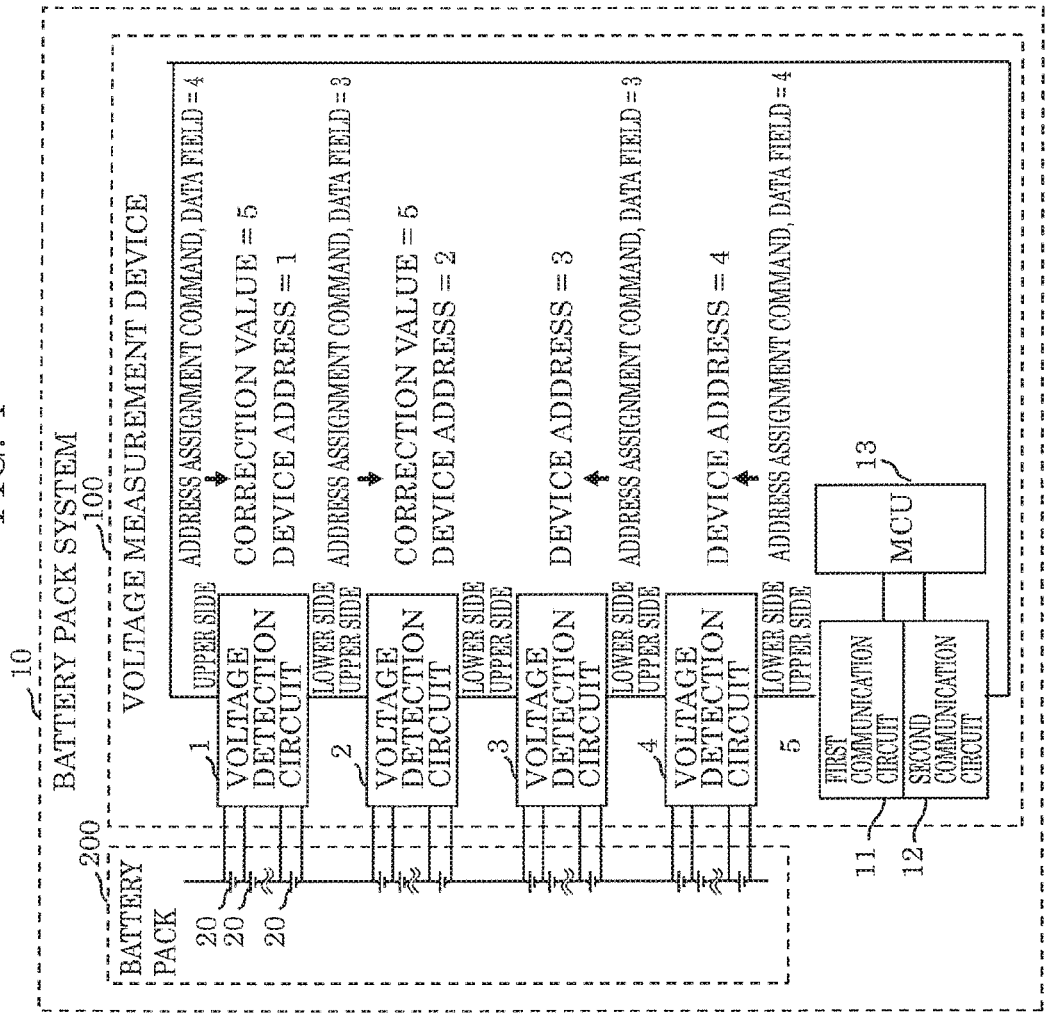
FIG. 4 is a diagram illustrating an address assignment command according to Embodiment 1.

FIG. 4 is a diagram illustrating an address assignment command according to Embodiment 1. FIG. 4 is an operation example in the case where a failure is present on a communication path. In a flow of an address assignment command in the cases where a failure is present on a communication path between voltage detection circuit 2 and voltage detection circuit 3, an MCU sends the address assignment command to a lower side of voltage detection circuit 4 via first communication circuit 11. In a data field in the address assignment command, 4 indicating the number of voltage detection circuits is specified.

In addition, when lower communication circuit 26 of voltage detection circuit 4 receives the address assignment command, lower device address generating circuit 281 extracts the data field, outputs the value that is 4 as a device address, and stores the device address in device address holding circuit 21. Lower next-device address generating circuit 282 outputs, as a next-device address, 3 that is the result of subtracting 1 from 4 that is the value of the data field extracted.

In addition, lower address assignment command generating circuit 283 generates a new address assignment command including a data field in which 3 that is the next-device address has been set. Upper communication circuit 25 sends the new address assignment command to voltage detection circuit 3.

Likewise, voltage detection circuit 3 which receives the address assignment command including the data field in which 3 has been set, and stores, in device address holding circuit 21, 3 that is the value of the data field.

The MCU sends the address assignment command to an upper side of voltage detection circuit 1 via second communication circuit 12. In a data field in the address assignment command, 4 indicating the number of voltage detection circuits is specified. As a correction value for each voltage detection circuit, 5 is specified.

When upper communication circuit 25 of voltage detection circuit 1 receives an address assignment command, upper device address generating circuit 271 extracts a data field, outputs, as a device address, 1 that is the result of subtracting 4 that is the value of a data field from the correction value, and stores the device address in device address holding circuit 21. Upper next-device address generating circuit 272 outputs, as a next-device address, 3 that is the result of subtracting 1 from 4 that is the value of the data field extracted. In addition, upper address assignment command generating circuit 273 generates a new address assignment command including a data field in which 3 that is the next-device address has been set. Lower communication circuit 26 sends the new address assignment command to voltage detection circuit 2.

Likewise, voltage detection circuit 2 which receives the address assignment command including the data field in which 3 has been set, and stores, in device address holding circuit 21, 2 that is the result of subtracting the value of the data field from the correction value.

In this way, 1 to 4 are correctly set as device addresses of voltage detection circuits 1 to 4.

It is to be noted that, in this example, the correction value is the value obtained by adding 1 to the number of voltage detection circuits.

In this way, even when there is a failure in a communication path between voltage detection circuits, the voltage detection device according to Embodiment 1 is capable of setting a device address for a voltage detection circuit located at a lower side below a failure part according to an address assignment command from the lower side and set a device address for a voltage detection circuit located at an upper side above a failure part according to an address assignment command from the upper side.

Next, a device address assigning method according to Embodiment 1 is described. Each of FIGS. 5A and 5B is a diagram illustrating a device address assigning method according to Embodiment 1. Each of FIGS. 5A and 5B illustrates processing in a device address assigning method according to Embodiment 1. FIG. 5A indicates processing in the case where controller 13 sends an address assignment command from a lower side, and FIG. 5B indicates processing in the case where controller 13 sends an address assignment command from an upper side.

The device address assigning method in FIG. 5A includes: a step in which controller 13 sends an address assignment command to the lower side of the lowermost voltage detection circuit via first communication circuit 11 (S51); a step in which the voltage detection circuit generates a device address from a value of a data field in the address assignment command received from a lower side, and stores the device address in device address holding circuit 21 (S52); and a step in which the voltage detection circuit generates a new address assignment command by updating the value of the data field in the address assignment command received from the lower side, and sends the new address assignment command to an upper side (S53).

The device address assigning method in FIG. 5B includes: a step in which controller 13 sends an address assignment command to the upper side of the uppermost voltage detection circuit via second communication circuit 12 (S55); a step in which the voltage detection circuit generates a device address from a value of a data field in the address assignment command received from an upper side, and stores the device address in device address holding circuit 21 (S56); and a step in which the voltage detection circuit generates a new address assignment command by updating the value of the data field of the address assignment command received from the upper side, and sends the new address assignment command to a lower side (S57).

Voltage measurement device 100 which performs the processing in FIGS. 5A and 5B includes: a plurality of voltage detection circuits 1 to 5 which measure cell voltages of battery pack 200 configured to include a plurality of cells 20 connected in series; controller 13; first communication circuit 11; and second communication circuit 12. The plurality of voltage detection circuits are connected in a daisy chain. Controller 13 is connected to the lowermost voltage detection circuit via first communication circuit 11 and to the uppermost voltage detection circuit via second communication circuit 12. Each of the voltage detection circuits includes device address holding circuit 21.

In addition, battery pack system 10 according to Embodiment 1 includes: voltage measurement device 100; and battery pack 200 configured to include the plurality of cells 20 connected in series.

Variations of Embodiment 1

Each of FIGS. 6A and 6B is a diagram illustrating a device address assigning method according to Variation of Embodiment 1. FIG. 6A indicates a case where controller 13 sends an address assignment command from a lower side, and FIG. 6B indicates a case where controller 13 sends an address assignment command from an upper side.

The device address assigning method in FIG. 6A includes: a step in which controller 13 sends an address assignment command to the lower side of the lowermost voltage detection circuit via first communication circuit 11 (S61); a step in which the voltage detection circuit stores, as a device address, the value of the data field in the address assignment command received from a lower side, in device address holding circuit 21 (S62); and a step in which the voltage detection circuit generates a new address assignment command by decreasing the value of the data field in the address assignment command received from a lower side, and sends the new address assignment command to an upper side (S63).

The device address assigning method in FIG. 6B includes: a step in which controller 13 sends an address assignment command to the upper side of the uppermost voltage detection circuit via second communication circuit 12 (S65); a step in which the voltage detection circuit stores, as a device address, the result of subtracting the value of a data field in the address assignment command received from an upper side from a given correction value in device address holding circuit 21 (S66); and a step in which the voltage detection circuit generates a new address assignment command by decreasing the value of the data field in the address assignment command received from the upper side, and sends the new address assignment command to a lower side (S67).

It is to be noted that, as illustrated in FIG. 1B, the voltage measurement device may include communication circuit 14 instead of first communication circuit 11 and second communication circuit 12. Communication circuit 14 may perform not bi-directional communication but single-directional communication.

As described above, voltage measurement device 100 according to Embodiment 1 is a voltage measurement device including a plurality of voltage detection circuits which measure cell voltages of a plurality of cells connected in series. The voltage detection circuit includes: a device address generating circuit which generates a device address according to a first address assignment command received from a preceding voltage detection circuit located at a preceding stage; and an address assignment command generating circuit which generates a second address assignment command according to the first address assignment command, and sends the second address assignment command to a next voltage detection circuit located at a next stage.

Here, when an endmost voltage detection circuit among the plurality of voltage detection circuits is a lowermost voltage detection circuit, and an other endmost voltage detection circuit is an uppermost voltage detection circuit, the preceding voltage detection circuit is one of the lower voltage detection circuit and the upper voltage detection circuit, and the next voltage detection circuit is the other one of the lower voltage detection circuit and the upper voltage detection circuit. The address assignment command generating circuit may: generate the second address assignment command according to the first address assignment command received from the lower voltage detection circuit and sends the second address assignment command to the upper voltage detection circuit; and generate the second address assignment command according to the first address assignment command received from the upper voltage detection circuit and sends the second address assignment command to the lower voltage detection circuit.

Here, the device address generating circuit may generate a same device address for (i) the device address according to the first address assignment command received from the lower voltage detection circuit and (ii) the device address according to the first address assignment command received from the upper voltage detection circuit. Here, the first address assignment command may include a data field.

Here, the device address generating circuit may generate the device address using a value of the data field.

Here, the address assignment command generating circuit may generate the second address assignment command obtained by decreasing or increasing the value of the data field.

Here, when the device address generating circuit receives the first address assignment command from the lower voltage detection circuit, the device address generating circuit may output, as the device address, a value of the data field in the address assignment command received.

Here, when the device address generating circuit receives the first address assignment command from the upper voltage detection circuit, the device address generating circuit may generate, as the device address, the value obtained by subtracting a value of the data field from the correction value.

Here, the address assignment command generating circuit may generate the second address assignment command by decreasing a value of the data field in the first address assignment command received from the lower voltage detection circuit.

Here, the address assignment command generating circuit may generate the second address assignment command by decreasing a value of the data field in the first address assignment command received from the upper voltage detection circuit.

Here, the voltage measurement device may include a controller which is connected to a voltage detection circuit located at the lowermost stage among the plurality of voltage detection circuits, is connected to a voltage detection circuit located at the uppermost stage, send the communication command, and receive the reply.

Here, the correction value may be included in the address assignment command.

Here, the correction value may be a predetermined value.

Here, the voltage measurement device may include a battery pack including the plurality of cells connected in series.

In addition, the voltage detection circuit according to Embodiment 1 is a voltage detection circuit included in the plurality of voltage detection circuits included in the voltage measurement device which measure cell voltages of a plurality of cells connected in series. The voltage detection circuit includes: a device address generating circuit which generates a device address according to a first address assignment command received from a preceding voltage detection circuit; and an address assignment command generating circuit which generates a second address assignment command according to the first address assignment command, and sends the second address assignment command to a next voltage detection circuit. In addition, the device address generating method according to Embodiment 1 is a device address generating method in a voltage measurement device which includes a plurality of voltage detection circuits and measures cell voltages of the plurality of cells connected in series. The device address generating method includes: generating a device address according to a first address assignment command received from a preceding voltage detection circuit, generates a second address assignment command according to the first address assignment command, and sends the second address assignment command to a next voltage detection circuit.

Embodiment 2

A voltage detection circuit, voltage measurement device 100, battery pack system 10, and a voltage measurement method according to Embodiment 2 are described with reference to FIG. 7 to FIG. 9B mainly focusing on differences from the above-described embodiment.

Figure 7:
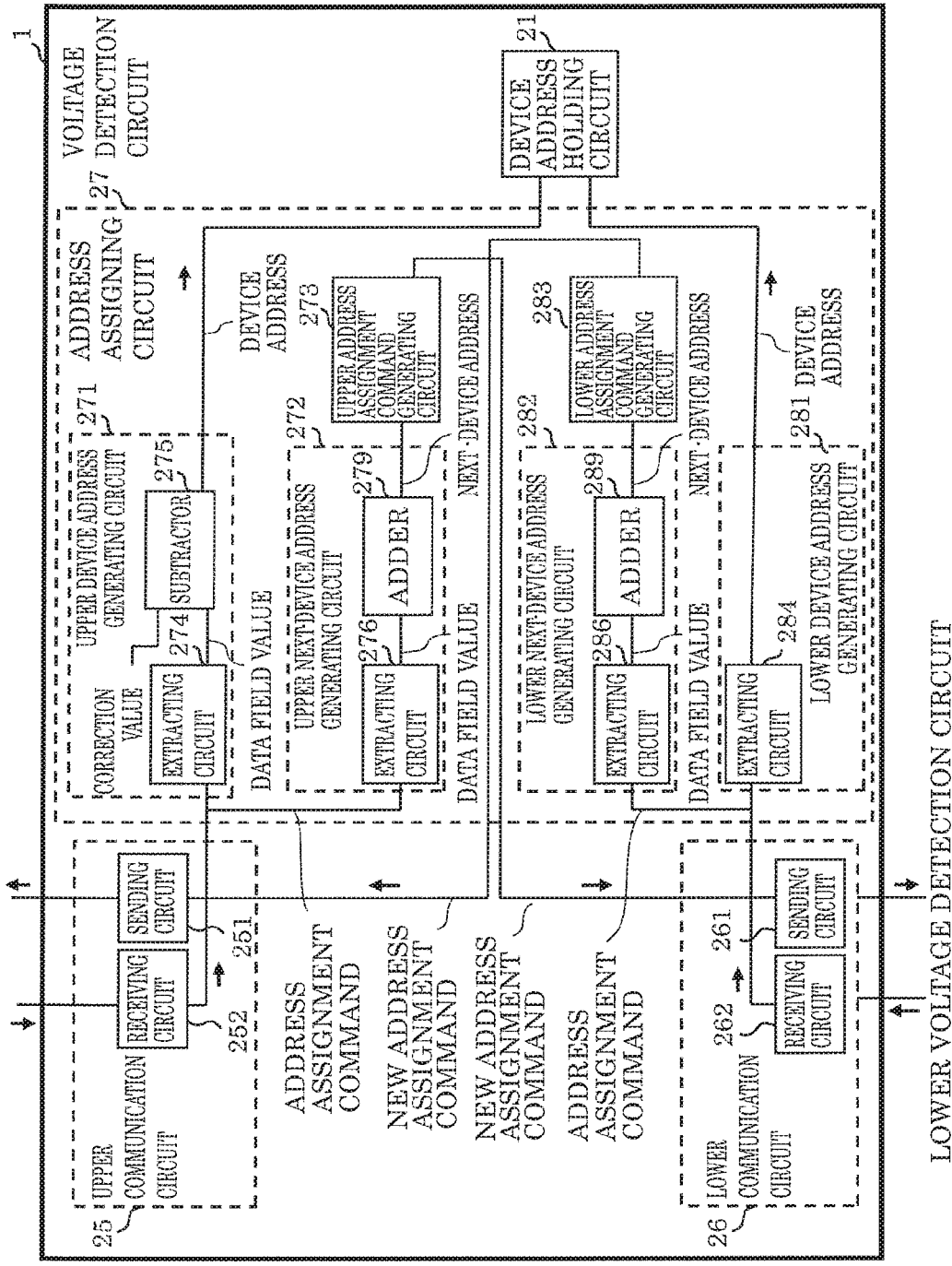
FIG. 7 is a diagram illustrating one of the voltage detection circuits according to Embodiment 2.

FIG. 7 is a diagram illustrating one of the voltage detection circuits according to Embodiment 2. Voltage detection circuit 1 in the same diagram is different from the voltage detection circuit in FIG. 3 in that upper next-device address generating circuit 272 includes adder 279 instead of subtractor 277, and in that lower next-device address generating circuit 283 includes adder 289 instead of subtractor 287. The following description is given mainly focusing on differences therebetween. It is to be noted that voltage detection circuits 2 to 4 illustrated are configured to have a configuration similar to those of the voltage detection circuits in FIG. 7.

In Embodiment 2: lower device address generating circuit 281 extracts a value of a data field in the address assignment command, and outputs the value as a device address; lower next-device address generating circuit 282 generates a device address of a next voltage detection circuit by increasing the value of the data field in the address assignment command; upper device address generating circuit 271 subtracts the value of the data field in the address assignment command from a given correction value and outputs the result as a device address; and upper next-device address generating circuit 272 increases the value of the data field in the address assignment command to generate a device address for a next voltage detection circuit.

In addition, as illustrated in FIG. 7, the voltage detection circuit according to Embodiment 2 is different from the voltage detection circuit (in FIG. 3) according to Embodiment 1 in that each of lower next-device address generating circuit 282 and upper next-device address generating circuit 272 includes an adder which is used to generate a next-device address as a replacement for the subtractor in the voltage detection circuit according to Embodiment 1.

In addition, lower next-device address generating circuit 282 extracts the value of the data field from the address assignment command received, and outputs a value obtained by the adder adding 1 to the value of the data field as a next-device address.

In addition, upper next-device address generating circuit 272 also outputs a value obtained by adding 1 to the value of the data field as a next-device address.

In addition, as an operation example in the case where a failure is present on a communication path, since device addresses are used to identify respective voltage detection circuits, voltage detection circuits may be assigned with 1, 2, 3, and 4 in an ascending order from the lowermost voltage detection circuit.

Figure 8:
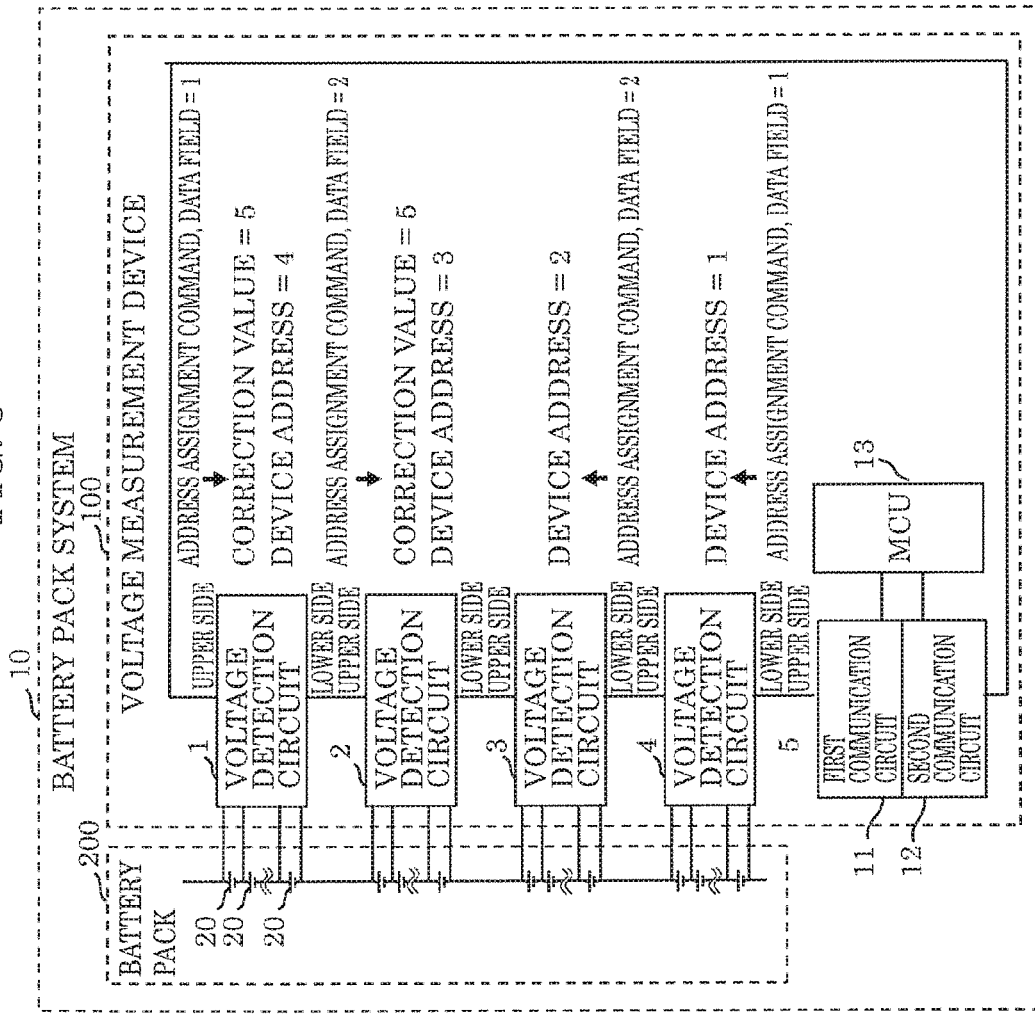
FIG. 8 is a diagram illustrating an address assignment command according to Embodiment 2.

FIG. 8 is a diagram illustrating an address assignment command according to Embodiment 2.

FIG. 8 illustrates a flow of an address assignment command in the case where a failure is present on a communication path between voltage detection circuit 2 and voltage detection circuit 3.

The MCU sends an address assignment command to a lower side of voltage detection circuit 4 via first communication circuit 11. The address assignment command includes a data field in which 1 has been set.

Lower device address generating circuit 281 of voltage detection circuit 4 extracts the data field, outputs the value that is 1 as a device address, and stores the device address in device address holding circuit 21. Lower next-device address generating circuit 282 outputs, as a next-device address, 2 that is the result of adding 1 to 1 that is the value of the data field extracted. In addition, lower address assignment command generating circuit 283 generates a new address assignment command has a data field in which 2 that is the next-device address has been set. Upper communication circuit 25 sends the new address assignment command to voltage detection circuit 3.

Likewise, voltage detection circuit 3 which receives the address assignment command in which the data field has 2 as the value of the data field, and stores, in device address holding circuit 21, 2 that is the value of the data field.

The MCU sends an address assignment command an upper side of voltage detection circuit 1 via second communication circuit 12. The address assignment command has a data field in which 1 has been set.

Upper device address generating circuit 271 of voltage detection circuit 1 outputs, as a device address, 4 that is the result of subtracting 1 that is the value of the data field from a correction value, and stores the device address in device address holding circuit 21. Upper next-device address generating circuit 272 outputs, as a next-device address, 2 that is the result of adding 1 to 1 that is the value of the data field extracted. In addition, upper address assignment command generating circuit 273 generates a new address assignment command including a data field in which 2 that is the next-device address has been set. Lower communication circuit 26 sends the new address assignment command to voltage detection circuit 2.

Likewise, voltage detection circuit 2 which receives the address assignment command in which the data field has 2 as the value of the data field, and stores, in device address holding circuit 21, 3 that is the result of subtracting the value of the data field from the correction value.

In this way, 1 to 4 are correctly set as device addresses of voltage detection circuits 4 to 1.

In addition, as illustrated in FIG. 7, even when there is a failure in a communication path between voltage detection circuits, the voltage detection circuit according to Embodiment 2 is capable of setting a device address for a voltage detection circuit located at a lower side below a failure part according to an address assignment command from the lower side and set a device address for a voltage detection circuit located at an upper side above a failure part according to an address assignment command from the upper side.

Figure 9B:
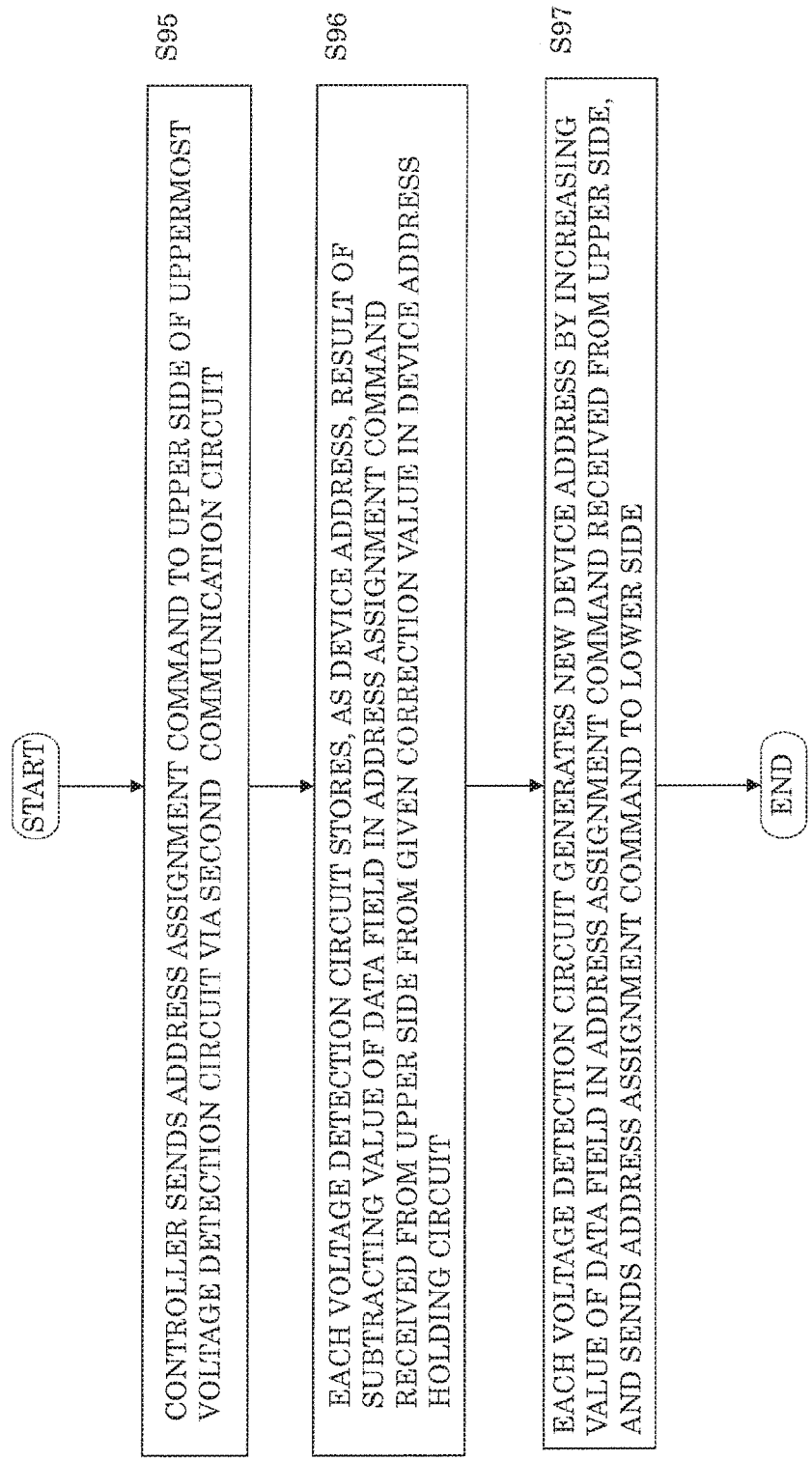
FIG. 9B is a diagram explaining a voltage measurement method according to Embodiment 1.

Next, each of FIGS. 9A and 9B is a diagram illustrating a device address assigning method according to Variation of Embodiment 2. FIG. 9A indicates a case where controller 13 sends an address assignment command from a lower side, and FIG. 9B indicates a case where controller 13 sends an address assignment command from an upper side.

The device address assigning method in FIG. 9A includes: a step in which controller 13 sends an address assignment command to the lower side of the lowermost voltage detection circuit via first communication circuit 11 (S91); a step in which the voltage detection circuit stores, as a device address, the value of the data field of the address assignment command received from a lower side, in device address holding circuit 21 (S92); and a step in which the voltage detection circuit generates a new address assignment command by increasing the value of the data field of the address assignment command received from a lower side, and sends the new address assignment command to an upper side (S93).

The device address assigning method in FIG. 9B includes: a step in which controller 13 sends an address assignment command to the upper side of the uppermost voltage detection circuit via second communication circuit 12 (S95); a step in which the voltage detection circuit stores, as a device address, the result of subtracting the value of the address assignment command received from an upper side from a given correction value, in device address holding circuit 21 (S96); and a step in which the voltage detection circuit generates a new address assignment command by increasing the value of the data field of the address assignment command received from the upper side, and sends the new address assignment command to a lower side (S97).

In addition, battery pack system 10 according to Embodiment 2 includes: voltage measurement device 100; and battery pack 200 configured to include a plurality of cells 20 connected in series.

As described above, in voltage measurement device 100 according to Embodiment 2, the address assignment command generating circuit generates the second address assignment command by increasing the value of the data field in the first address assignment command received from the lower voltage detection circuit.

Here, the address assignment command generating circuit may generate the second address assignment command by increasing the value of the data field in the first address assignment command received from the upper voltage detection circuit.

Embodiment 3

A voltage detection circuit, voltage measurement device 100, battery pack system 10, and a voltage measurement method according to Embodiment 3 are described with reference to FIG. 10 to FIG. 12B mainly focusing on differences from the above-described embodiments.

In Embodiment 3: lower device address generating circuit 281 extracts a value of a data field in the address assignment command, and outputs the value as a device address; lower next-device address generating circuit 282 generates a device address of a next voltage detection circuit by decreasing the value of the data field in the address assignment command; upper device address generating circuit 271 extracts the value of the data field in the address assignment command and outputs the result as a device address; and upper next-device address generating circuit 272 increases the value of the data field in the address assignment command to generate a device address for a next voltage detection circuit.

Figure 10:
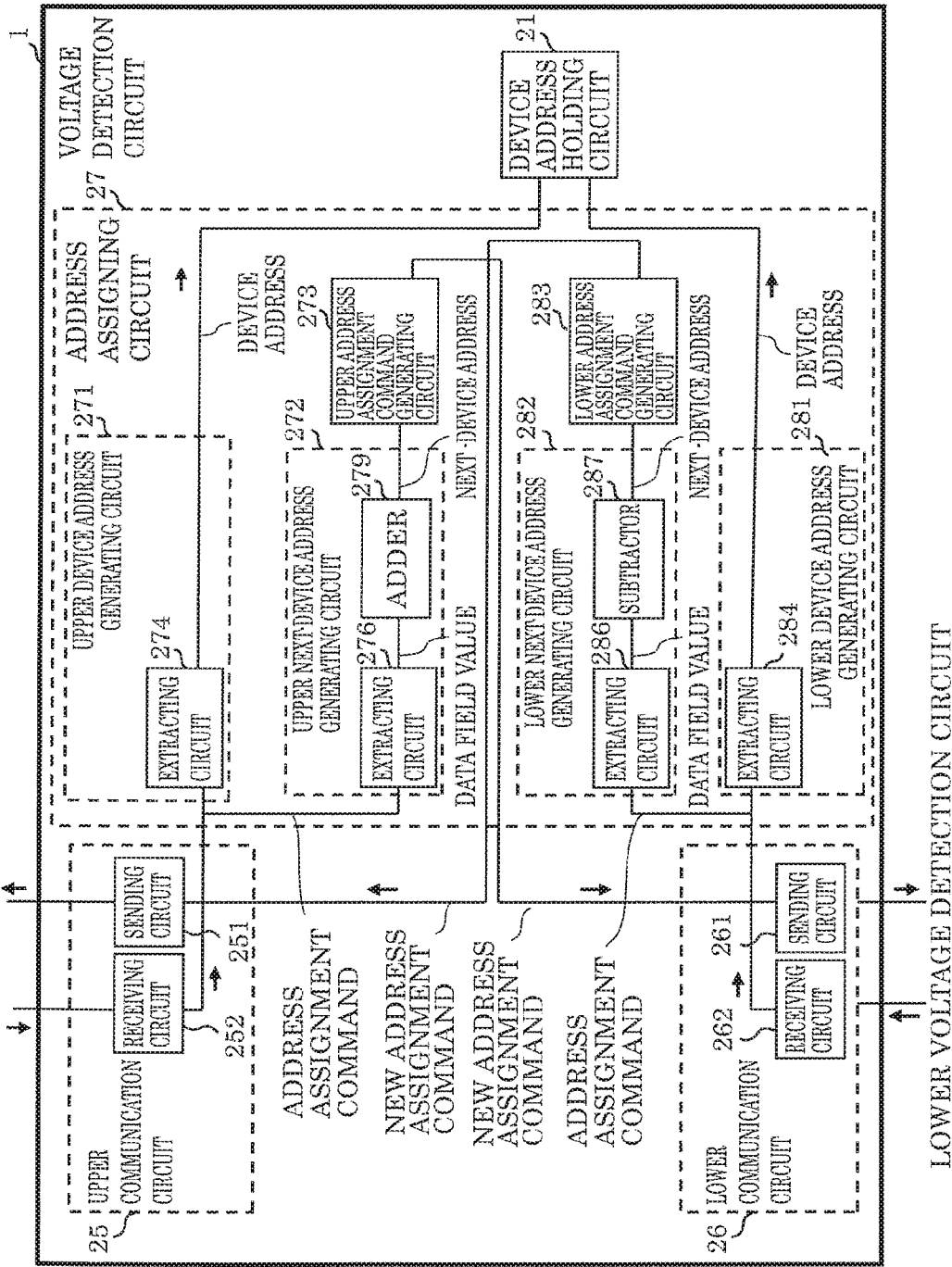
FIG. 10 is a configuration diagram of a battery pack system which includes a voltage measurement device including voltage detection circuits, according to Embodiment 3.

FIG. 10 illustrates a block diagram of the voltage detection circuit according to Embodiment 3. Voltage detection circuit 1 in the same diagram is different from the voltage detection circuit in FIG. 3 in that: upper device address generating circuit 271 does not include subtractor 275; and upper next-device address generating circuit 272 includes adder 279 instead of subtractor 277. The following description is given mainly focusing on differences therebetween. It is to be noted that voltage detection circuits 2 to 4 are configured to have a configuration similar to those of the voltage detection circuits in FIG. 10.

Unlike the voltage detection circuit in FIG. 7 which includes upper device address generating circuit 271 having subtractor 275 which is used to generate a device address, the voltage detection circuit in FIG. 10 does not include subtractor 275.

In addition, upper device address generating circuit 271 extracts a value of a data field in the address assignment command received, and stores the value as a device address in device address holding circuit 21.

At the same time, upper next-device address generating circuit 272 causes an adder to add 1 to the value of the data field extracted and output the result as a next-device address.

Figure 11:
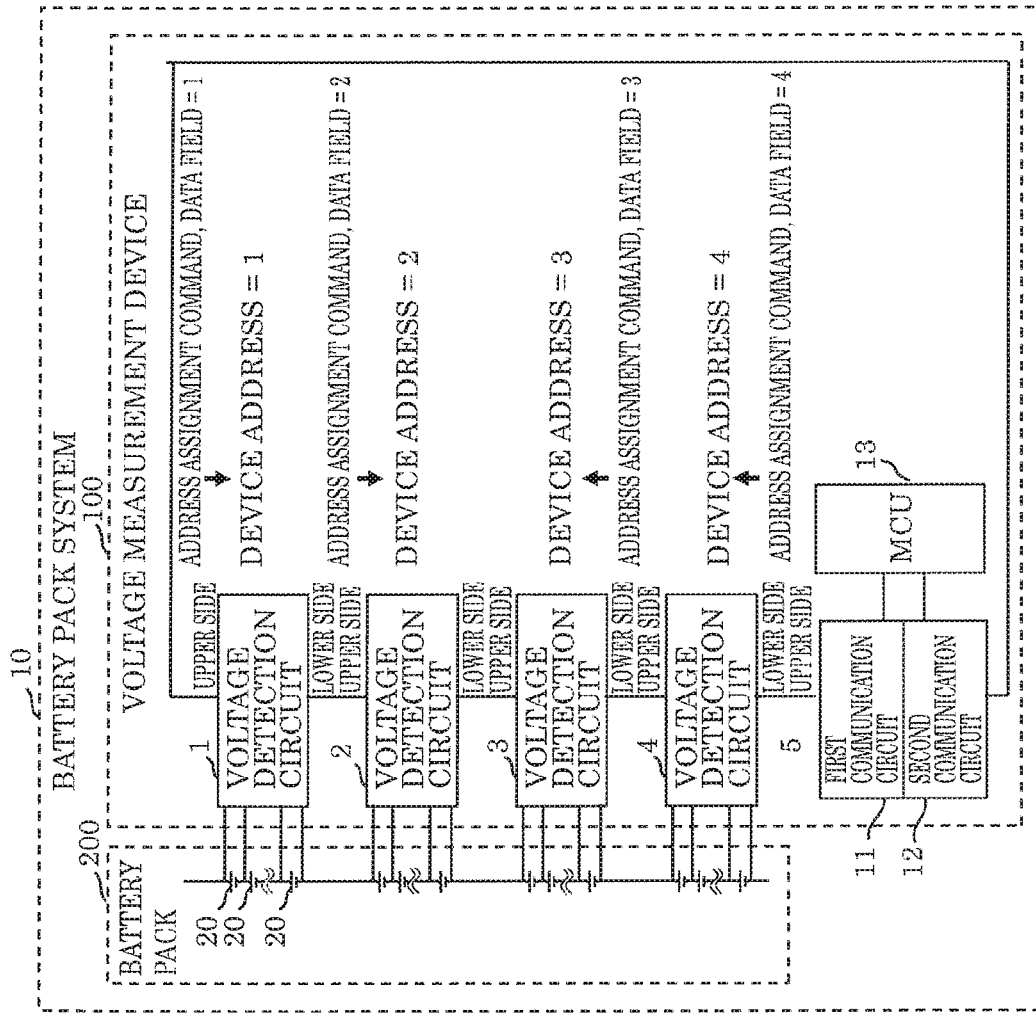
FIG. 11 is a diagram illustrating an address assignment command according to Embodiment 3.

Next, FIG. 11 indicates, as an operation example in a case where a failure is present on a communication path, a flow of an address assignment command in the case where a failure is present on a communication path between voltage detection circuit 2 and voltage detection circuit 3.

As indicated in FIG. 11, an MCU sends an address assignment command to the lower side of voltage detection circuit 4 via first communication path 11. In a data field of the address assignment command, 4 indicating the number of voltage detection circuits is specified.

In addition, when lower communication circuit 26 of voltage detection circuit 4 receives the address assignment command, lower device address generating circuit 281 extracts the data field, outputs the value that is 4 as a device address, and stores the device address in device address holding circuit 21. Lower next-device address generating circuit 282 outputs, as a next-device address, 3 that is the result of subtracting 1 from 4 that is the value of the data field extracted. In addition, lower address assignment command generating circuit 283 generates a new address assignment command including a data field in which 3 that is the next-device address has been set. Upper communication circuit 25 sends the new address assignment command to voltage detection circuit 3.

Likewise, voltage detection circuit 3 which receives the address assignment command in which the data field has 3 as the value of the data field, and stores 3 that is the value of the data field in device address holding circuit 21.

The MCU sends the address assignment command to an upper side of voltage detection circuit 1 via second communication circuit 12. In the data field in the address assignment command, 1 is specified.

When upper communication circuit 25 of voltage detection circuit 1 receives an address assignment command, upper device address generating circuit 271 extracts 1 that is the value of the data field, outputs 1 as a device address, and stores the device address in device address holding circuit 21. Upper next-device address generating circuit 272 outputs, as a next-device address, 2 that is the result of adding 1 to 1 that is the value of the data field extracted. In addition, upper address assignment command generating circuit 273 generates a new address assignment command including a data field in which 2 that is the next-device address has been set. Lower communication circuit 26 sends the new address assignment command to voltage detection circuit 2.

Likewise, voltage detection circuit 2 which receives the address assignment command in which the data field has 2 as the value of the data field, and stores 2 that is the value of the data field in device address holding circuit 21.

In this way, 1 to 4 are correctly set as device addresses of voltage detection circuits 1 to 4.

In this way, even when there is a failure in a communication path between voltage detection circuits, voltage detection device 100 according to Embodiment 3 is capable of setting a device address for a voltage detection circuit located at a lower side below a failure part according to an address assignment command from the lower side and set a device address for a voltage detection circuit located at an upper side above a failure part according to an address assignment command from the upper side.

Figure 12A:
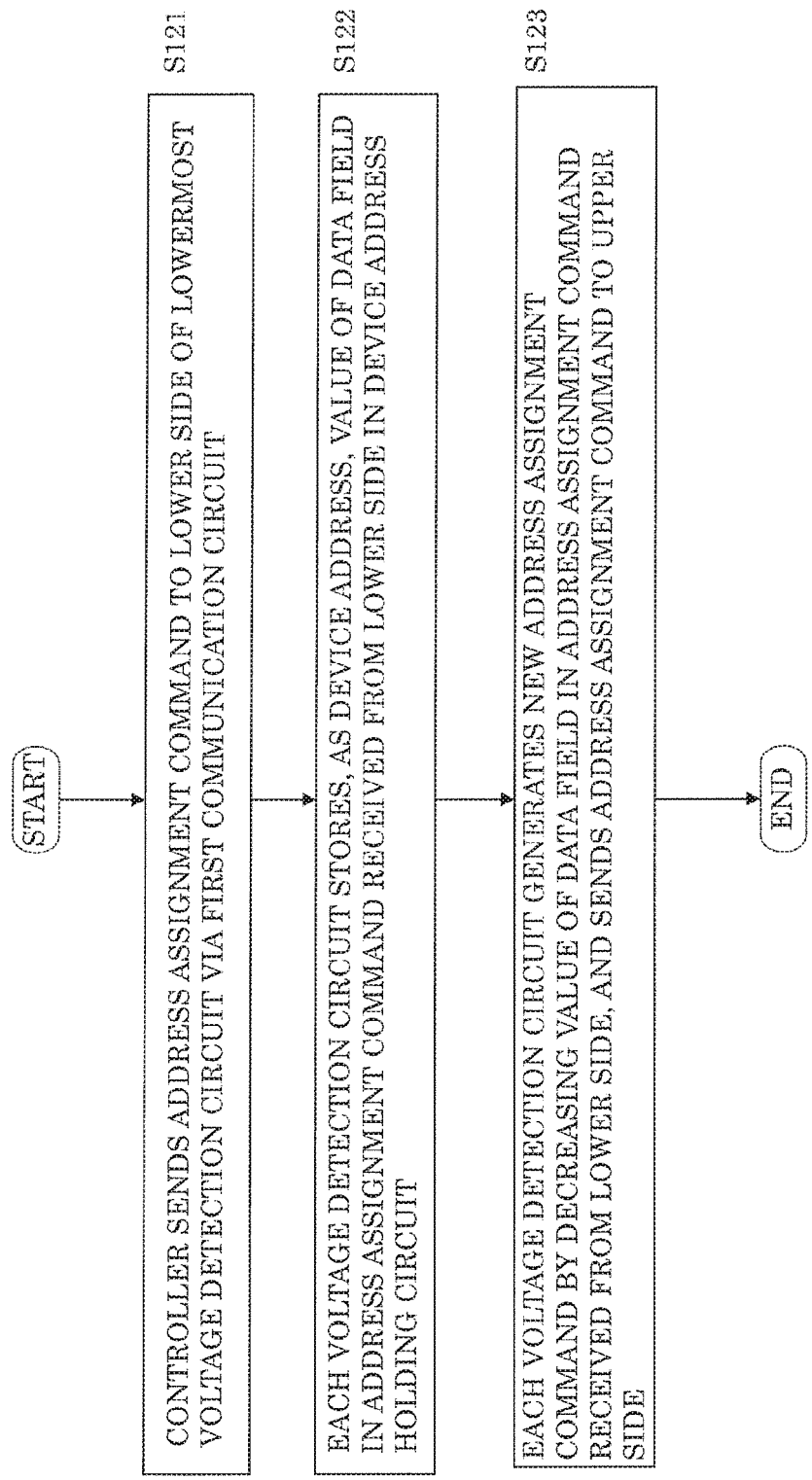
FIG. 12A is a diagram explaining a voltage measurement method according to Embodiment 1.

Next, each of FIGS. 12A and 12B is a diagram illustrating a device address assigning method according to Variation of Embodiment 3. FIG. 12A indicates a case where controller 13 sends an address assignment command from a lower side, and FIG. 12B indicates a case where controller 13 sends an address assignment command from an upper side.

The device address assignment method in FIG. 12A includes: a step in which controller 13 sends an address assignment command to the lower side of a lowermost voltage detection circuit via first communication circuit 11 (S121); a step in which the voltage detection circuit stores, as a device address, the value of the data field in the address assignment command received from a lower side, in device address holding circuit 21 (S122); and a step in which the voltage detection circuit generates a new address assignment command by decreasing the value of the data field in the address assignment command received from the lower side, and sends the new address assignment command to an upper side (S123).

The device address assignment method in FIG. 12B includes: a step in which controller 13 sends an address assignment command to the upper side of an uppermost voltage detection circuit via second communication circuit 12 (S125); a step in which the voltage detection circuit stores, as a device address, the value of the data field in the address assignment command received from an upper side, in device address holding circuit 21 (S126); and a step in which the voltage detection circuit generates a new address assignment command by increasing the value of the data field in the address assignment command received from the upper side, and sends the new address assignment command to a lower side (S127).

As described above, in voltage measurement device 100 according to Embodiment 3: (i) when the device address generating circuit receives the first address assignment command from the lower voltage detection circuit, the device address generating circuit generates, as the device address, the value of the data field in the first address assignment command received, and when the device address generating circuit receives the first address assignment command from the upper voltage detection circuit, the device address generating circuit generates, as the device address, the value of the data field in the first address assignment command received; and (ii) the address assignment command generating circuit generates the second address assignment command by decreasing the value of the data field in the first address assignment command received from the lower voltage detection circuit, and generates the second address assignment command by increasing the value of the data field in the first address assignment command received from the upper voltage detection circuit.

In addition, battery pack system 10 according to Embodiment 3 includes: voltage measurement device 100; and battery pack 200 configured to include a plurality of cells 20 connected in series.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful as, for example, a voltage measurement device, a voltage detection circuit, and a device address generating method for vehicles.

What is claimed is:

1. A voltage measurement device, comprising:
a plurality of voltage detection circuits which measure cell voltages of a plurality of cells connected in series from a lowermost side to an uppermost side,
wherein each of the plurality of voltage detection circuits includes a lowermost voltage detection circuit, an uppermost voltage detection circuit and one or more middle voltage detection circuits disposed between the lowermost voltage detection circuit and the uppermost voltage detection circuit, each of the one or more middle voltage detection circuits includes:
a device address generating circuit which generates a device address according to a first address assignment command received from a preceding voltage detection circuit located at a preceding stage; and
an address assignment command generating circuit which generates a second address assignment command according to the first address assignment command, and sends the second address assignment command to a next voltage detection circuit located at a next stage,
the preceding voltage detection circuit is one of a lower voltage detection circuit located at a lower side or an upper voltage detection circuit located at an upper side among the plurality of voltage detection circuits, and the next voltage detection circuit is the other of the lower voltage detection circuit or the upper voltage detection circuit among the plurality of voltage detection circuits, and
the device address generating circuit generates a same device address for (i) the device address according to the first address assignment command received from the lower voltage detection circuit and (ii) the device address according to the first address assignment command received from the upper voltage detection circuit.

2. The voltage measurement device according to claim 1, wherein
the address assignment command generating circuit:
generates the second address assignment command according to the first address assignment command received from the lower voltage detection circuit, and sends the second address assignment command to the upper voltage detection circuit, when the preceding voltage detection circuit is the lower voltage detection circuit; and
generates the second address assignment command according to the first address assignment command received from the upper voltage detection circuit, and sends the second address assignment command to the lower voltage detection circuit, when the preceding voltage detection circuit is the upper voltage detection circuit.

3. The voltage measurement device according to claim 1, wherein the first address assignment command includes a data field.

4. The voltage measurement device according to claim 3, wherein the device address generating circuit generates the device address using a value of the data field.

5. The voltage measurement device according to claim 3, wherein the address assignment command generating circuit generates the second address assignment command obtained by decreasing or increasing a value of the data field.

6. The voltage measurement device according to claim 3, wherein when the device address generating circuit receives the first address assignment command from the lower voltage detection circuit, the device address generating circuit outputs, as the device address, a value of the data field in the address assignment command received.

7. The voltage measurement device according to claim 3, wherein when the device address generating circuit receives the first address assignment command from the upper voltage detection circuit, the device address generating circuit generates, as the device address, a value obtained by subtracting a value of the data field from a correction value.

8. The voltage measurement device according to claim 3, wherein the address assignment command generating circuit generates the second address assignment command obtained by decreasing a value of the data field in the first address assignment command received from the lower voltage detection circuit.

9. The voltage measurement device according to claim 3, wherein the address assignment command generating circuit generates the second address assignment command obtained by decreasing a value of the data field in the first address assignment command received from the upper voltage detection circuit.

10. The voltage measurement device according to claim 3, wherein the address assignment command generating circuit generates the second address assignment command obtained by increasing a value of the data field in the first address assignment command received from the lower voltage detection circuit.

11. The voltage measurement device according to claim 3, wherein the address assignment command generating circuit generates the second address assignment command obtained by increasing a value of the data field in the first address assignment command received from the upper voltage detection circuit.

12. The voltage measurement device according to claim 3, wherein
when the device address generating circuit receives the first address assignment command from the lower voltage detection circuit, the device address generating circuit determines, as the device address, a value of the data field in the first address assignment command received, and the address assignment command generating circuit generates the second address assignment command obtained by decreasing a value of the data field in the first address assignment command received from the lower voltage detection circuit; and
when the device address generating circuit receives the first address assignment command from the upper voltage detection circuit, the device address generating circuit determines, as the device address, a value of the data field in the first address assignment command received, and the address assignment command generating circuit
generates the second address assignment command obtained by increasing a value of the data field in the first address assignment command received from the upper voltage detection circuit.

13. The voltage measurement device according to claim 1, further comprising:
a controller which is connected to the lowermost voltage detection circuit located at a lowermost stage and the uppermost voltage detection circuit located at an uppermost stage, and sends the first address assignment command.

14. A voltage detection circuit which measures cell voltages of a plurality of cells connected in series from a lowermost side to an uppermost side, the voltage detection circuit being one of a plurality of voltage detection circuits included in a voltage measurement device, the voltage detection circuit comprising:
a device address generating circuit which generates a device address according to a first address assignment command received from a preceding voltage detection circuit located at a preceding stage; and
an address assignment command generating circuit which generates a second address assignment command according to the first address assignment command, and sends the second address assignment command to a next voltage detection circuit located at a next stage,
wherein the preceding voltage detection circuit is one of a lower voltage detection circuit located at a lower side or an upper voltage detection circuit located at an upper side among the plurality of voltage detection circuits, and the next voltage detection circuit is the other of the lower voltage detection circuit or the upper voltage detection circuit, and
the device address generating circuit generates a same device address for (i) the device address according to the first address assignment command received from the lower voltage detection circuit and (ii) the device address according to the first address assignment command received from the upper voltage detection circuit.

15. A device address generating method performed by a voltage measurement device which measures cell voltages of a plurality of cells connected in series and includes a plurality of voltage detection circuits, the device address generating method comprising:
generating a device address according to a first address assignment command received from a preceding voltage detection circuit located at a preceding stage; and
generating a second address assignment command according to the first address assignment command, and sending the second address assignment command to a next voltage detection circuit located at a next stage,
wherein the preceding voltage detection circuit is one of a lower voltage detection circuit located at a lower side or an upper voltage detection circuit located at an upper side among the plurality of voltage detection circuits, and the next voltage detection circuit is the other of the lower voltage detection circuit or the upper voltage detection circuit, and
the device address generating method comprises generating a same device address for (i) the device address according to the first address assignment command received from the lower voltage detection circuit and (ii) the device address according to the first address assignment command received from the upper voltage detection circuit.

* * * * *